US011514953B2

(12) United States Patent
Fukuzumi et al.

(10) Patent No.: US 11,514,953 B2
(45) Date of Patent: Nov. 29, 2022

(54) INTEGRATED ASSEMBLIES, AND METHODS OF FORMING INTEGRATED ASSEMBLIES

(71) Applicant: Micron Technology, Inc., Boise, ID (US)

(72) Inventors: Yoshiaki Fukuzumi, Kanagawa (JP); Paolo Tessariol, Arcore (IT); David H. Wells, Boise, ID (US); Lars P. Heineck, Boise, ID (US); Richard J. Hill, Boise, ID (US); Lifang Xu, Boise, ID (US); Indra V. Chary, Boise, ID (US); Emilio Camerlenghi, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/243,937

(22) Filed: Apr. 29, 2021

(65) Prior Publication Data

US 2022/0068317 A1    Mar. 3, 2022

Related U.S. Application Data

(60) Provisional application No. 63/071,234, filed on Aug. 27, 2020.

(51) Int. Cl.
| | | |
|---|---|---|
| *G11C 11/34* | (2006.01) |
| *G11C 5/06* | (2006.01) |
| *H01L 21/50* | (2006.01) |
| *H01L 27/11582* | (2017.01) |
| *H01L 27/11556* | (2017.01) |
| *H01L 25/065* | (2006.01) |

(52) U.S. Cl.
CPC ............... *G11C 5/06* (2013.01); *H01L 21/50* (2013.01); *H01L 25/0657* (2013.01); *H01L 27/11556* (2013.01); *H01L 27/11582* (2013.01)

(58) Field of Classification Search
CPC ....... G11C 5/06; H01L 21/50; H01L 25/0657; H01L 27/11556; H01L 27/11582
USPC .................................................... 365/185.11
See application file for complete search history.

(56) References Cited

U.S. PATENT DOCUMENTS

| | | | |
|---|---|---|---|
| 9,397,114 B2 | 7/2016 | Yun et al. |
| 9,576,975 B2* | 2/2017 | Zhang | ............... H01L 27/11565 |
| 9,620,514 B2 | 4/2017 | Kai et al. |
| 9,673,389 B2* | 6/2017 | Murooka | .............. H01L 23/528 |

(Continued)

FOREIGN PATENT DOCUMENTS

| | | |
|---|---|---|
| KR | 10-2012-0129284 | 11/2012 |
| WO | WO 2016/053453 | 4/2016 |
| WO | WO | 11/2021 |
| | PCT/US2021/044713 | |

*Primary Examiner* — Viet Q Nguyen
(74) *Attorney, Agent, or Firm* — Wells St. John P.S.

(57) ABSTRACT

Some embodiments include an integrated assembly having a pair of adjacent memory-block-regions, and having a separator structure between the adjacent memory-block-regions. The memory-block-regions include a first stack of alternating conductive levels and first insulative levels. The separator structure includes a second stack of alternating second and third insulative levels. The second insulative levels are substantially horizontally aligned with the conductive levels, and the third insulative levels are substantially horizontally aligned with the first insulative levels. Some embodiments include methods of forming integrated assemblies.

24 Claims, 37 Drawing Sheets

(56) References Cited

U.S. PATENT DOCUMENTS

| | | | |
|---|---|---|---|
| 9,728,546 B2 | 8/2017 | Serov et al. | |
| 10,373,969 B2* | 8/2019 | Zhang | H01L 27/11565 |
| 10,381,086 B2* | 8/2019 | Goda | G11C 16/10 |
| 10,615,172 B2* | 4/2020 | Nagata | H01L 27/11556 |
| 10,903,237 B1* | 1/2021 | Hosoda | H01L 27/11519 |
| 11,094,627 B2* | 8/2021 | Machkaoutsan | H01L 23/5283 |
| 11,094,712 B2* | 8/2021 | Huo | H01L 23/5226 |
| 11,251,195 B2* | 2/2022 | Huo | H01L 27/11556 |
| 11,257,835 B2* | 2/2022 | Li | H01L 27/11519 |
| 11,257,836 B2* | 2/2022 | Hu | H01L 27/11582 |
| 11,270,428 B2* | 3/2022 | Fatih | G06T 7/60 |
| 11,348,930 B2* | 5/2022 | Yun | H01L 27/11548 |
| 11,380,707 B2* | 7/2022 | Matsuno | H01L 23/5226 |
| 2017/0062462 A1 | 3/2017 | Lee | |
| 2017/0103992 A1 | 4/2017 | Hachisuga et al. | |
| 2019/0252405 A1 | 8/2019 | Tsutsumi | |
| 2021/0091102 A1* | 3/2021 | Zhu | H01L 21/76831 |
| 2021/0335819 A1* | 10/2021 | Kanamori | H01L 29/7827 |
| 2022/0052062 A1* | 2/2022 | Zhang | H01L 27/11556 |

* cited by examiner

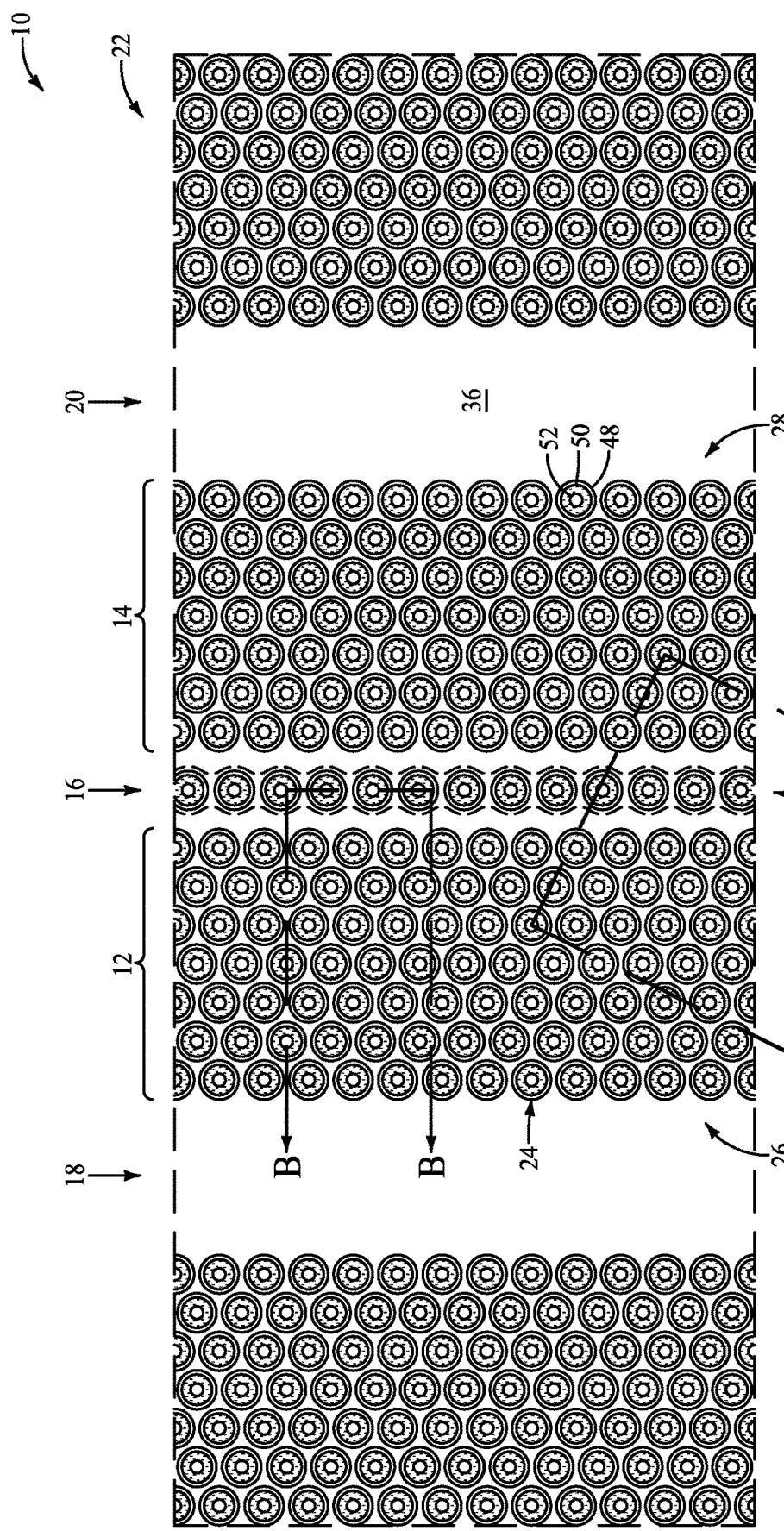

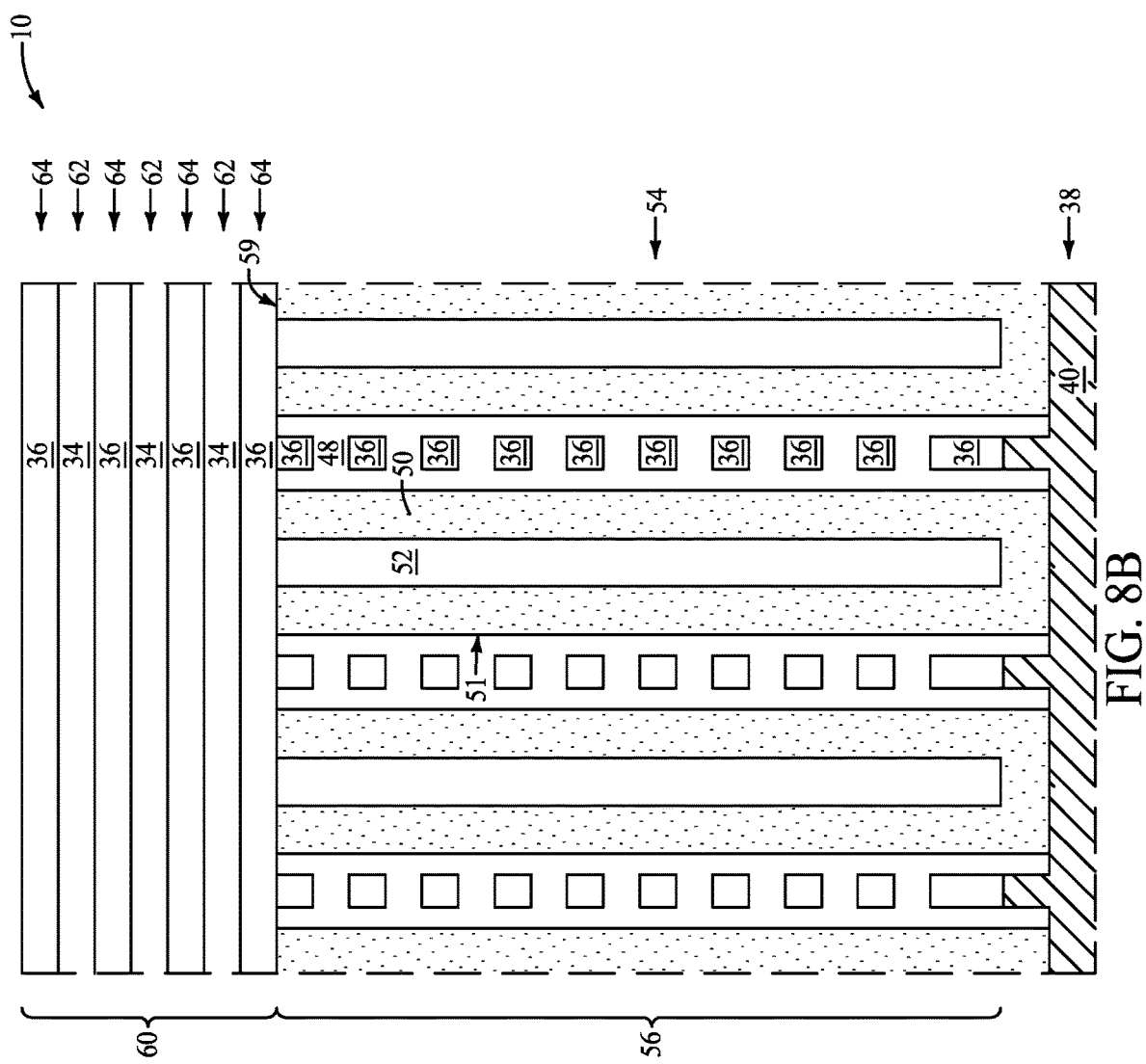

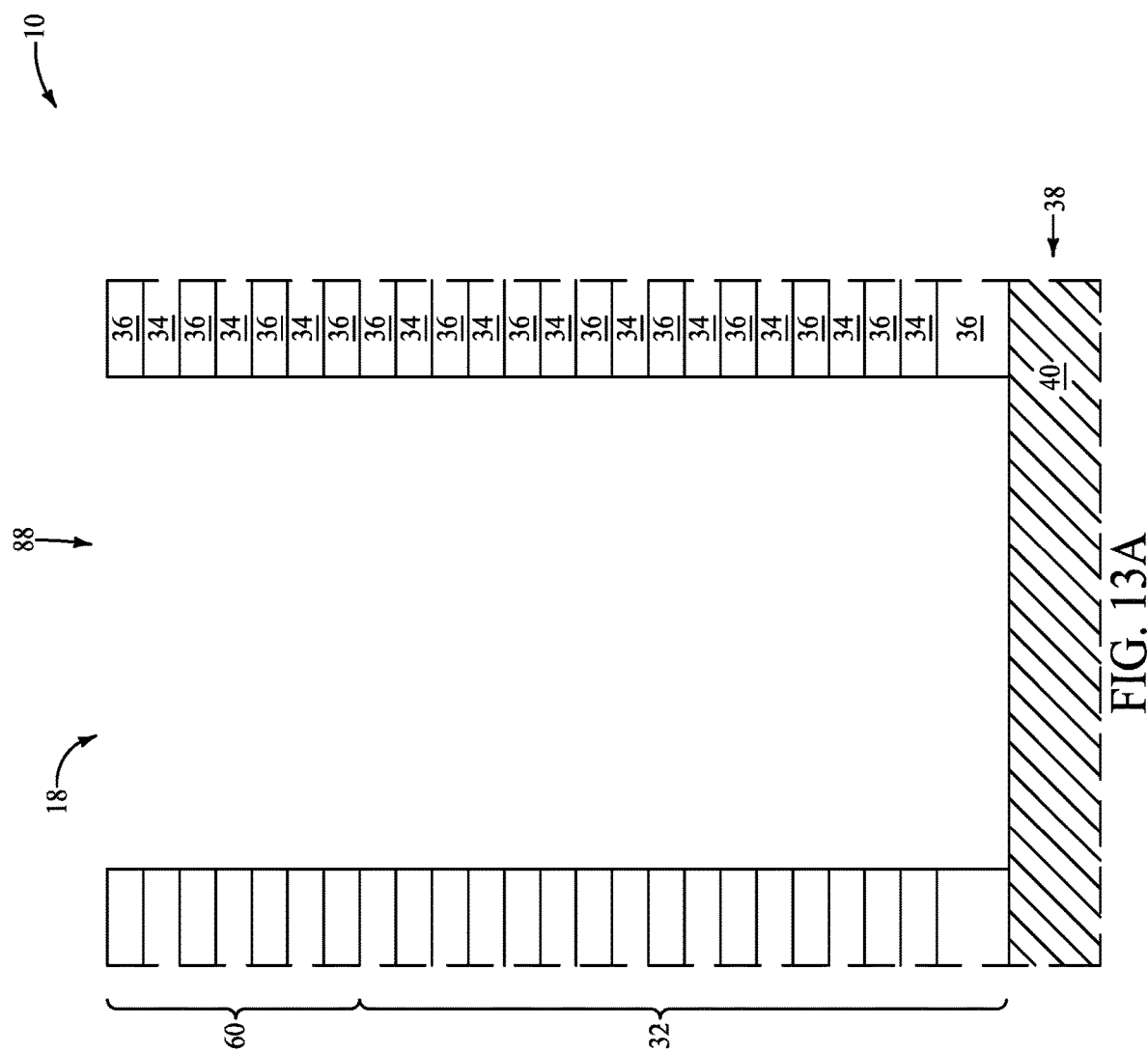

INTEGRATED ASSEMBLIES, AND METHODS OF FORMING INTEGRATED ASSEMBLIES

RELATED PATENT DATA

This application claims priority to and the benefit of U.S. Provisional Patent Application Ser. No. 63/071,234, filed Aug. 27, 2020, the disclosure of which is incorporated herein by reference.

TECHNICAL FIELD

Integrated assemblies (e.g., integrated memory). Methods of forming integrated assemblies.

BACKGROUND

Memory provides data storage for electronic systems. Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 5 is a diagrammatic top-down view. FIGS. 5A and 5B are diagrammatic cross-sectional side views along the lines A-A and B-B of FIG. 5, respectively. FIG. 5A-1 is a diagrammatic cross-sectional side view analogous to that of FIG. 5A in accordance with an example embodiment.

FIG. 6 is a diagrammatic top-down view. FIGS. 6A and 6B are diagrammatic cross-sectional side views along the lines A-A and B-B of FIG. 6, respectively.

FIGS. 7-7B are views of an integrated assembly at an example process stage which may follow that of FIGS. 6-6B. FIG. 7 is a diagrammatic top-down view. FIGS. 7A and 7B are diagrammatic cross-sectional side views along the lines A-A and B-B of FIG. 7, respectively.

FIGS. 8-8B are views of an integrated assembly at an example process stage which may follow that of FIGS. 7-7B. FIG. 8 is a diagrammatic top-down view. FIGS. 8A and 8B are diagrammatic cross-sectional side views along the lines A-A and B-B of FIG. 8, respectively.

FIG. 13A is a diagrammatic cross-sectional side view of a region of the assembly of FIG. 13.

DETAILED DESCRIPTION OF THE ILLUSTRATED EMBODIMENTS

Some embodiments include methods of forming integrated assemblies in which merged openings (e.g., merged cell-pillar-openings) are utilized to form separator structures between memory-block-regions. The separator structures may be narrower than conventional separator structures (e.g., conventional separator panels formed in conventional slits). In some embodiments, the separator structures formed from the merged openings may be utilized in combination with conventional slits, with the slits being utilized during removal and replacement of sacrificial material to form conductive wordline levels of vertically stacked memory (e.g., NAND memory configurations). Some embodiments include integrated assemblies. Example embodiments are described with reference to FIGS. 5-20.

Figure 5:
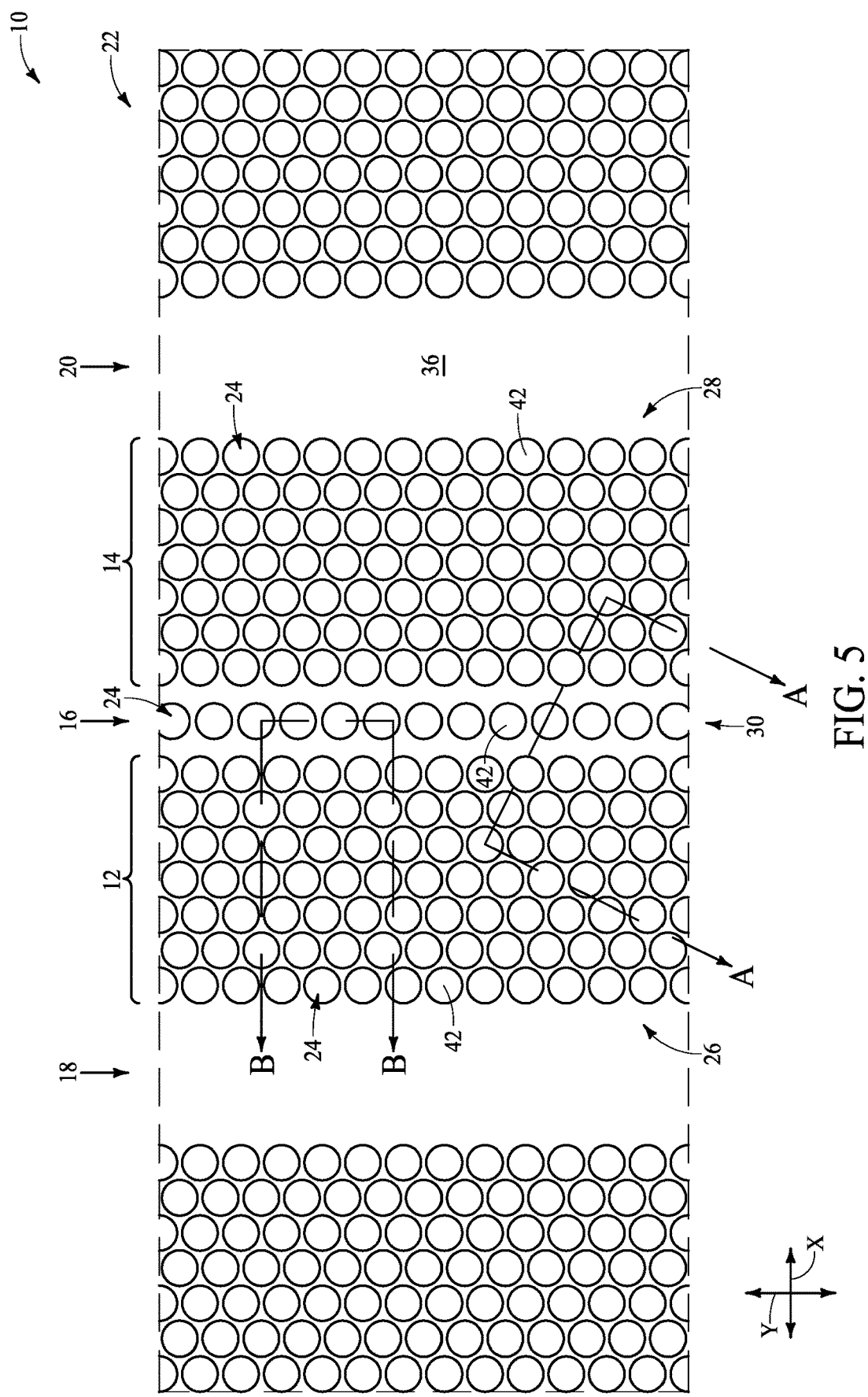
FIGS. 5-5B are views of an integrated assembly at an example process stage of an example method.

Referring to FIG. 5, an integrated assembly 10 is shown in top-down view. The assembly includes a pair of adjacent memory-block-regions 12 and 14, and includes a separator-structure-location (separator-structure-region) 16 between the regions 12 and 14. In some embodiments, the memory-block-regions 12 and 14 may be referred to as first and second memory-block-regions, respectively; with such first and second memory-block-regions being laterally adjacent to one another, and being laterally separated from one another by the separator-structure-location 16.

A pair of slit-locations (slit-regions) 18 and 20 are laterally adjacent the memory-block-regions 12 and 14, respectively. The slit-location 18 is on an opposing side of the memory-block-region 12 relative to the separator-structure-region 16, and the slit-location 20 is on an opposing side of the memory-block-region 14 relative to the separator-structure-region 16.

The illustrated portion of the assembly 10 of FIG. 5 may correspond to a memory array region 22. Cell-pillar-openings 24 are formed within the memory-block-regions 12 and 14, and eventually memory-cell-materials will be provided within the cell-pillar-openings 24. The cell-pillar-openings 24 within the first memory-block-region may be considered to correspond to a first array 26 of the cell-pillar-openings, and the cell-pillar-openings 24 within the second memory-block-region 14 may be considered to correspond to a second array 28 of the cell-pillar-openings.

A series of the cell-pillar-openings 24 is provided within the separator-structure-region 16. Such series is configured as a linear string 30 of the cell-pillar-openings. The linear string 30 extends along a first direction, with such first direction corresponding to an illustrated y-axis direction.

Figure 5A:
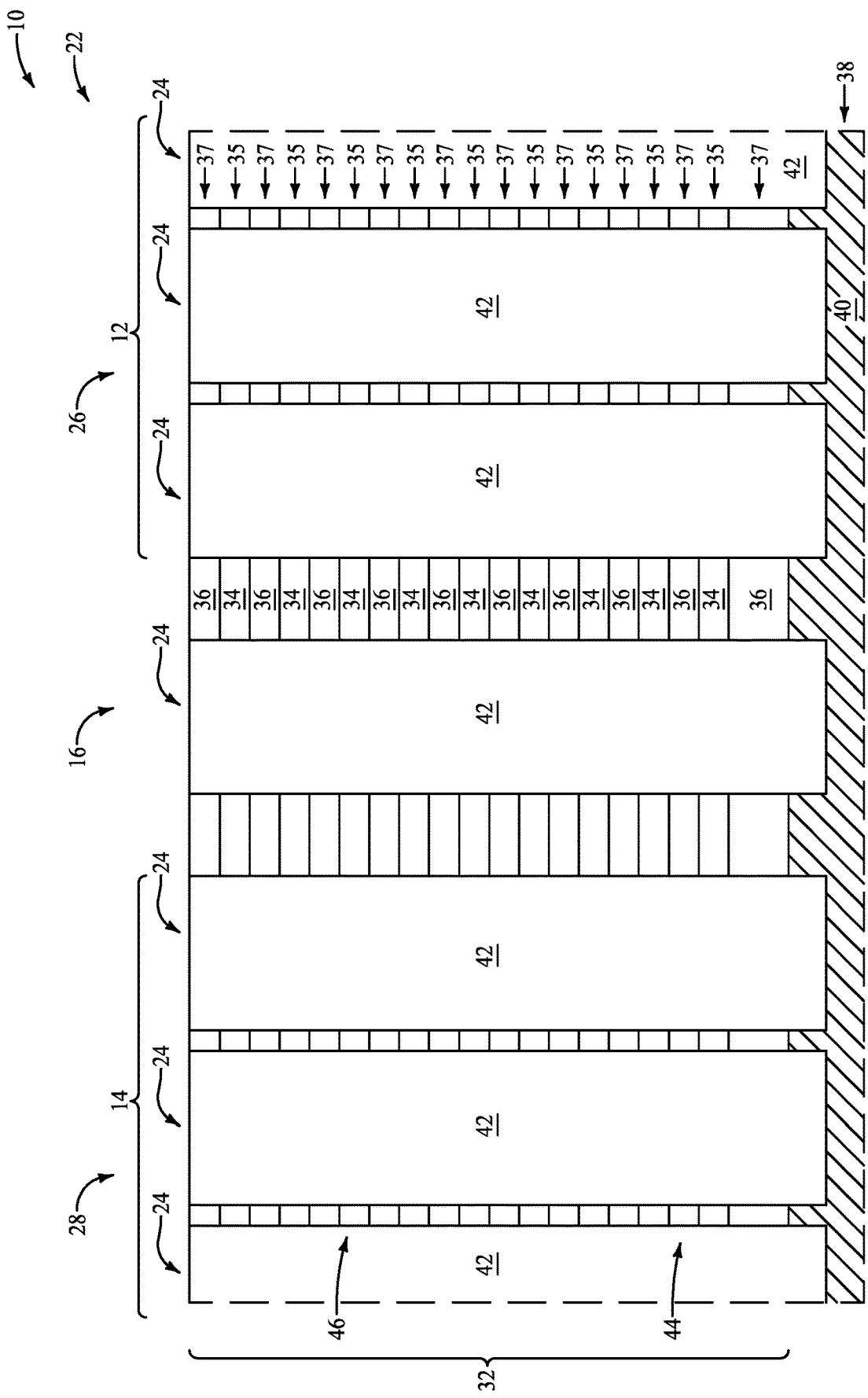
Figures 1, 5A:
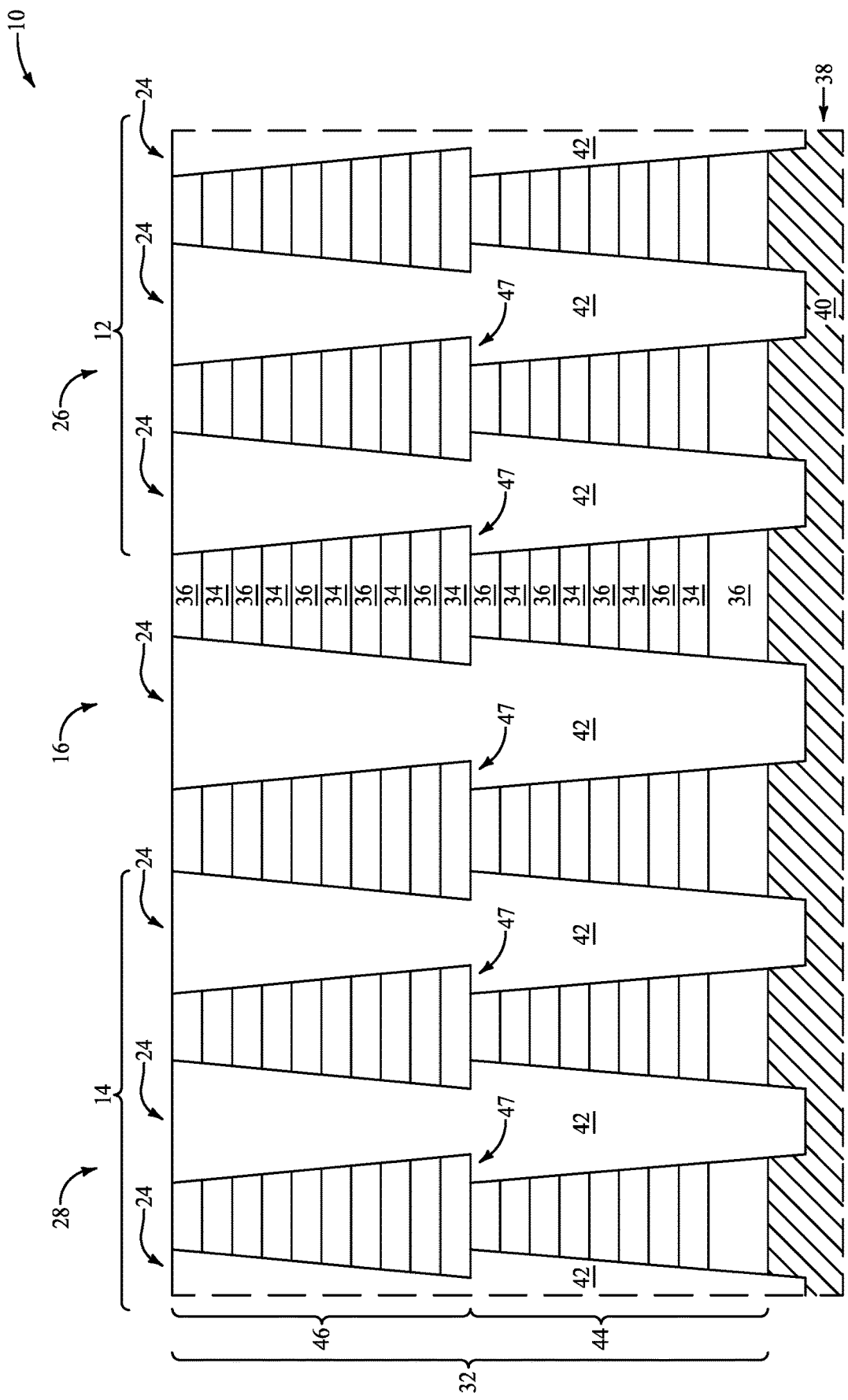
Figure 5B:
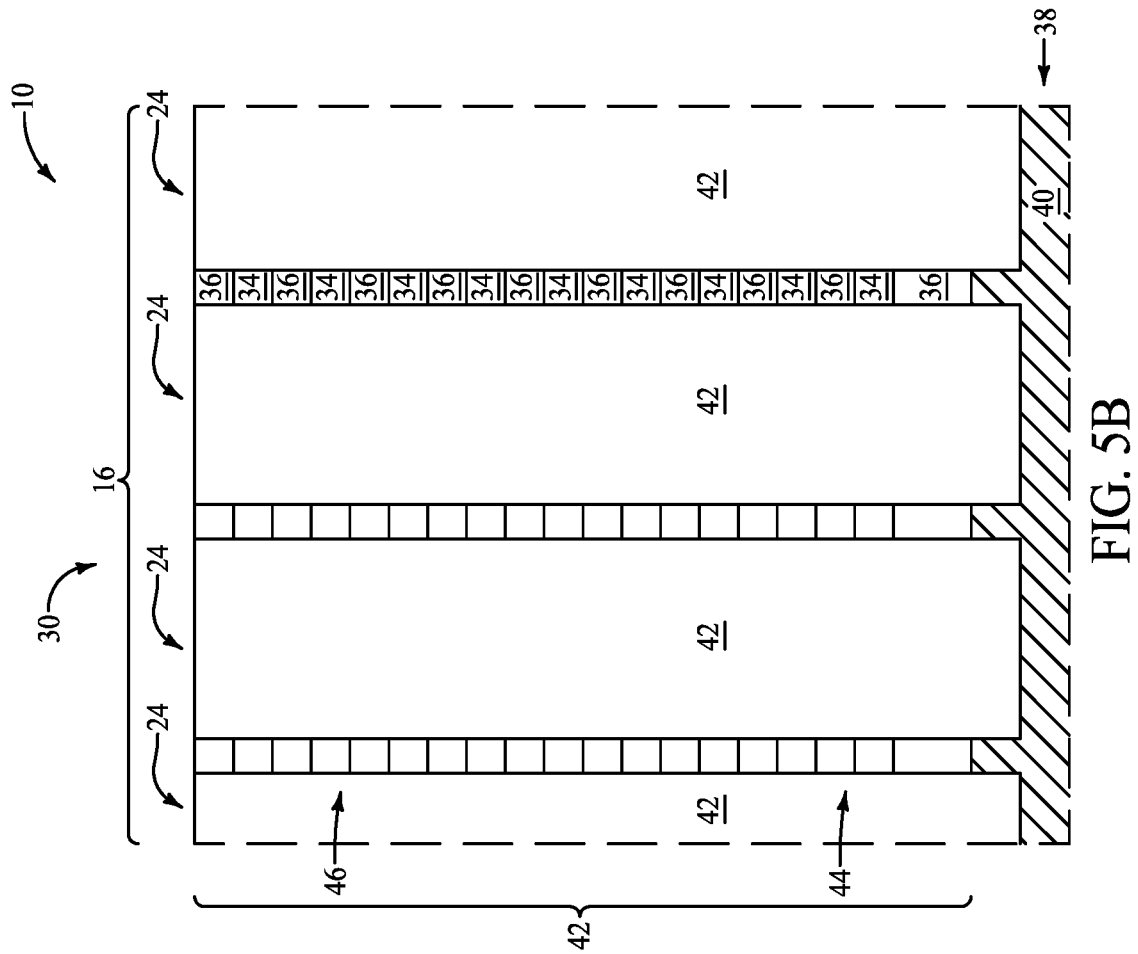

FIGS. 5A and 5B are cross-sectional side views along the lines A-A and B-B, respectively, of FIG. 5. The side views of FIGS. 5A and 5B are not to the same scale as the top view of FIG. 5. Rather, the views of FIGS. 5-5B are provided to diagrammatically illustrate example features of the assembly 10, rather than depicting specific scaled relationships of such features.

The side views of FIGS. 5A and 5B show that the pillar openings 24 extend through a stack 32 of alternating first and second materials 34 and 36. The stack 32 may be referred to as a first stack to distinguish it from other stacks formed at subsequent process stages.

The first material 34 is a sacrificial material, and may comprise any suitable composition(s). In some embodiments, the first material 34 may comprise, consist essentially of, or consist of silicon nitride.

The second material 36 is an insulative material, and may comprise any suitable composition(s). In some embodiments, the second material 36 may comprise, consist essentially of, or consist of silicon dioxide.

In some embodiments, the stack 32 may be considered to comprise alternating first and second levels (tiers) 35 and 37, with the first levels 35 comprising the material 34 and the second levels 37 comprising the material 36.

The tiers 35 and 37 may be of any suitable thicknesses; and may be the same thickness as one another, or may be different thicknesses relative to one another. In some embodiments, the tiers 35 and 37 may have vertical thicknesses within a range of from about 10 nanometers (nm) to about 400 nm. In the illustrated embodiment, the bottommost tier 37 is thicker than the other tiers 37. In other embodiments, the bottommost tier 37 may have a thickness which is about the same as the thickness of the other tiers 37, or may be less thick than the other tiers 37.

The tiers 35 ultimately become conductive levels of a memory arrangement. There may be any suitable number of the tiers 35 to form the desired number of conductive levels. In some embodiments, there may be at least 8 of the tiers 35, at least 16 of the tiers 35, at least 32 of the tiers 35, at least 64 of the tiers 35, etc.

The diagram of FIG. 5B shows that the stack 32 extends vertically (i.e., along an illustrated z-axis direction) relative to the horizontally-extending y-axis.

The stack 32 is supported over a conductive source structure 38. The source structure 38 comprises conductive material 40. The conductive material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 40 may comprise a conductive stack which includes metal-containing material (e.g., one or more of tungsten, tungsten silicide, etc.) and conductively-doped semiconductor material (e.g., one or more of conductively-doped silicon, conductively-doped germanium, etc.).

The conductive source structure 38 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The openings 24 are shown to pass through the stack 32, and to extend into the conductive structure 38. In other embodiments, the openings 24 may extend to an upper surface of the conductive structure 38 without penetrating into the conductive structure 38.

Sacrificial material 42 is formed within the cell-pillar-openings 24. The sacrificial material 42 may comprise any suitable composition(s), and in some embodiments may comprise one or more of silicon, carbon, tungsten, etc. In some embodiments, the sacrificial material 42 may include a liner (e.g., a liner comprising high-k material, with the term high-k meaning a dielectric constant greater than that of silicon dioxide, i.e., greater than about 3.9). Such liner is not shown in the drawings in order to simplify the drawings.

The stack 32 may comprise two or more decks. For instance, the stack 32 may comprise a first deck 44 and a second deck 46, with the second deck being formed over the first deck. The openings 24 may be formed in two steps. A first portion of the openings 24 may be formed within the first deck 24, and then filled with the sacrificial material 42; and subsequently the second deck 46 may be formed over the first deck, a second portion of the openings 24 may be formed within the second deck, and then the second portion of the openings 24 may be filled with the sacrificial material.

Figure 1:
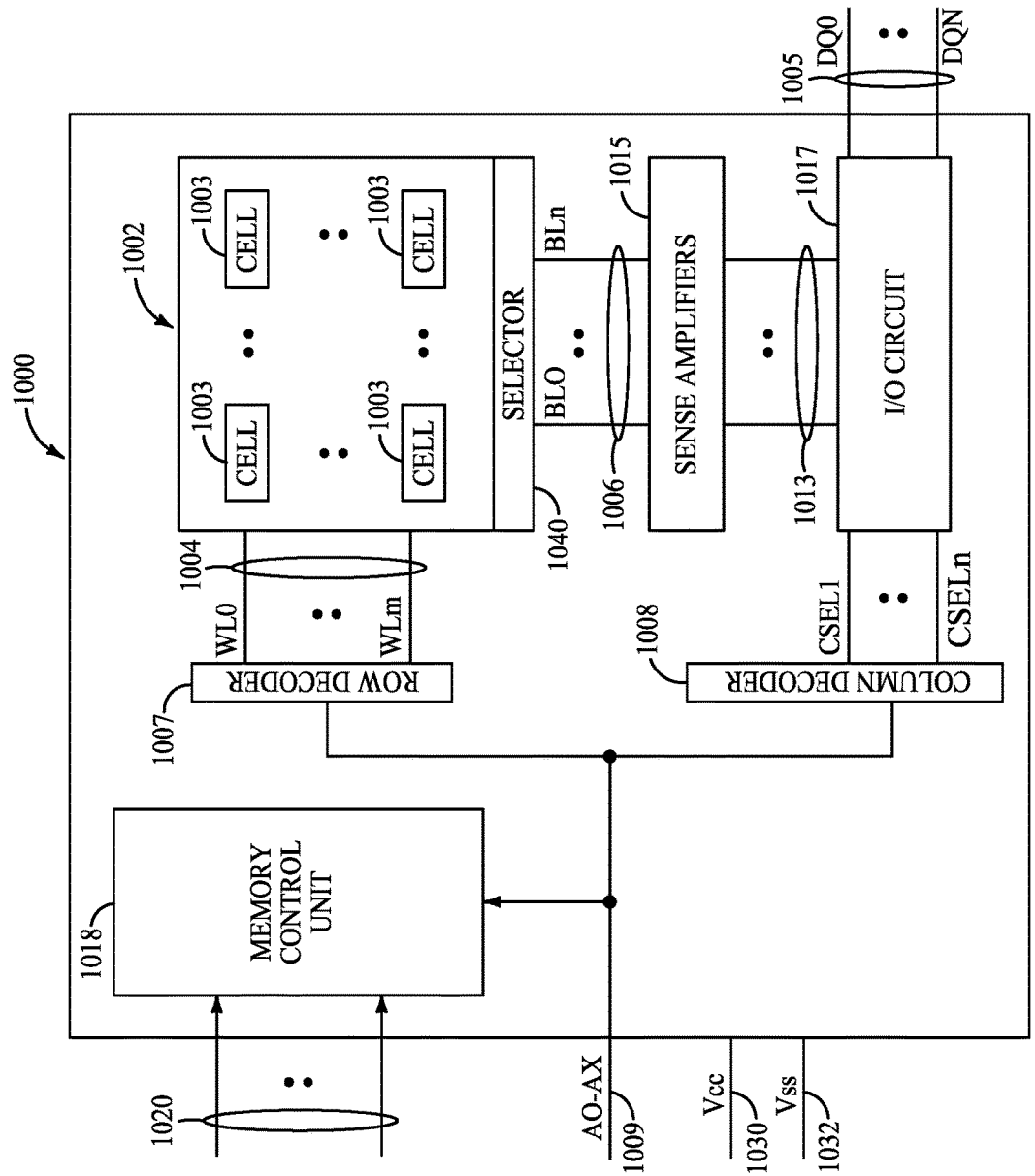
FIG. 1 shows a block diagram of a prior art memory device having a memory array with memory cells.
Figure 2:
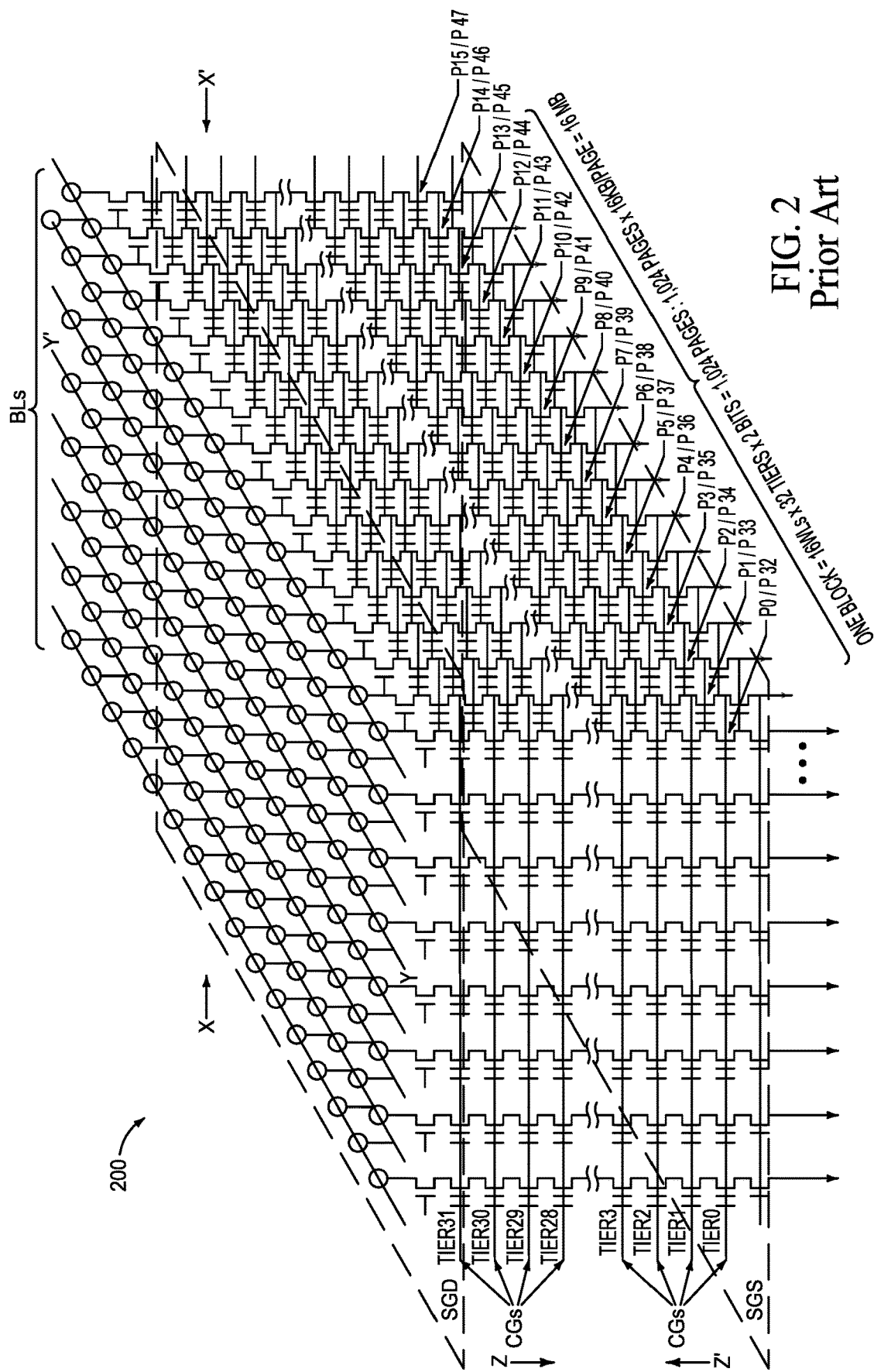
FIG. 2 shows a schematic diagram of the prior art memory array of FIG. 1 in the form of a 3D NAND memory device.
Figure 3:
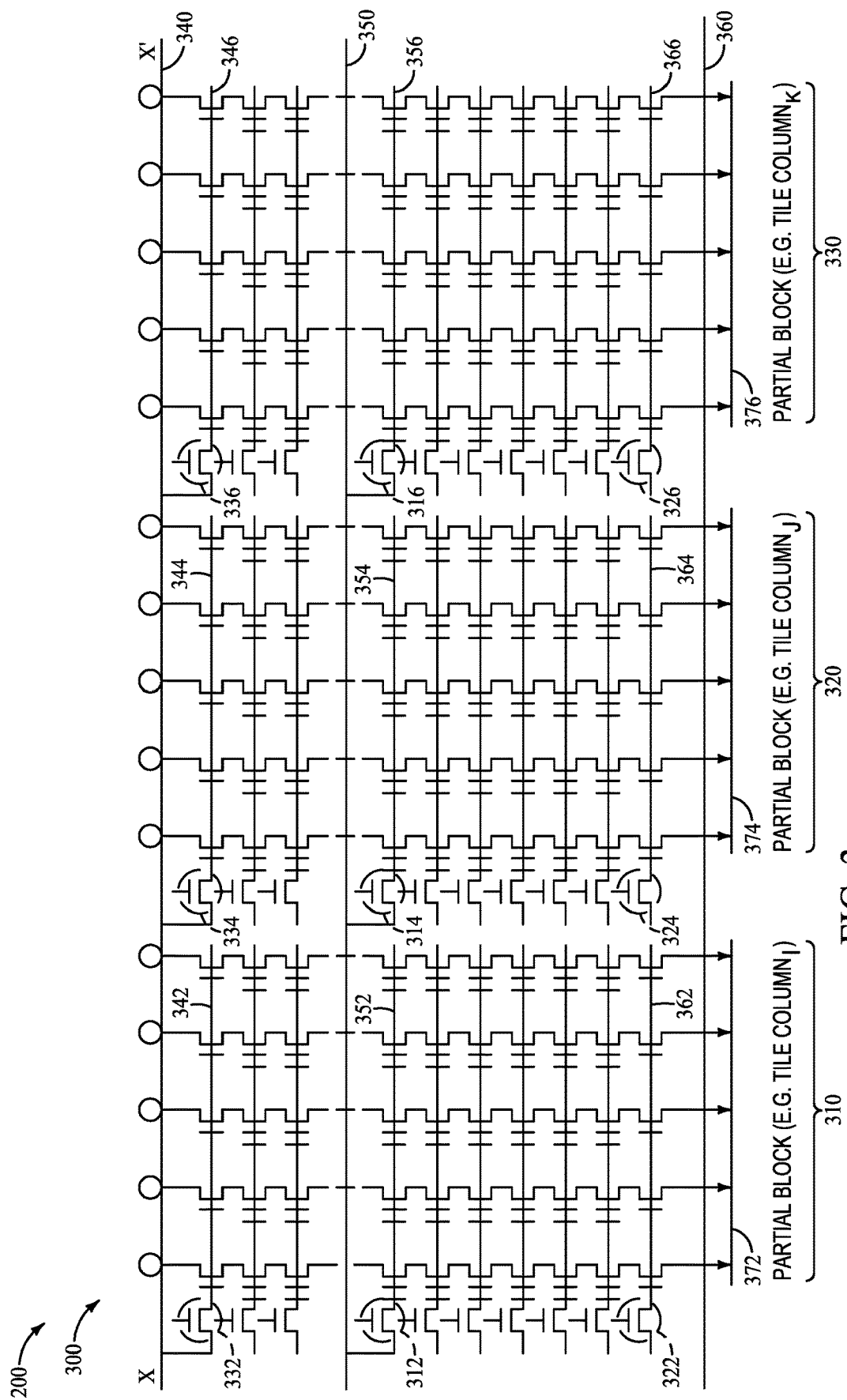
FIG. 3 shows a cross-sectional view of the prior art 3D NAND memory device of FIG. 2 in an X-X' direction.
Figure 4:
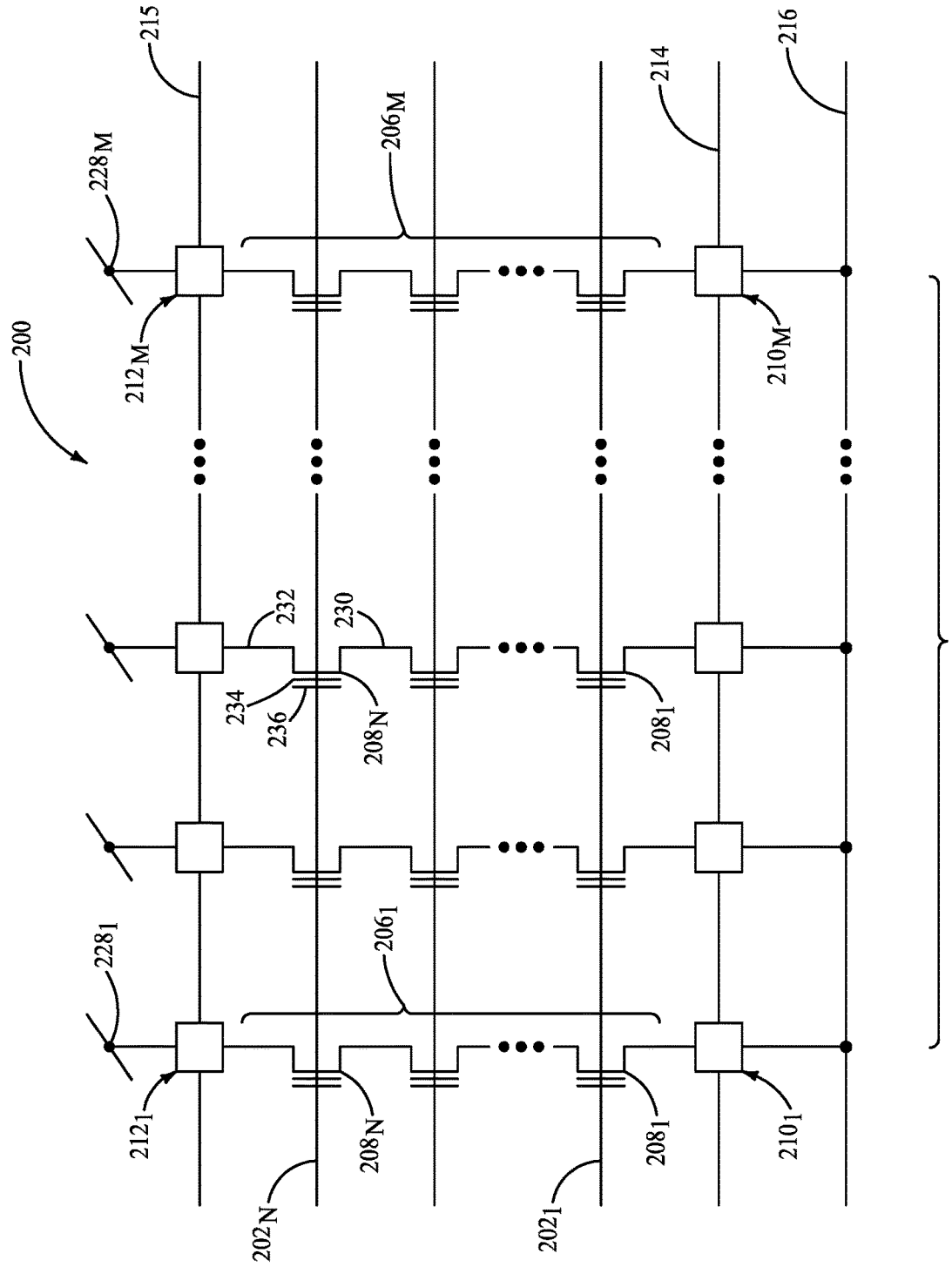
FIG. 4 is a schematic diagram of a prior art NAND memory array.

In some embodiments, inter-deck inflections may be detectable where portions of the openings 24 from the second deck meet the portions from the first deck. For instance, FIG. 5A-1 shows a configuration analogous to that of FIG. 5A, but shows inter-deck inflections 47 where portions of the openings 24 within the first deck 44 meet portions of the openings 24 within the second deck 46. In the illustrated embodiment, the openings 24 within each of the decks are tapered, and accordingly the inter-deck inflections 47 correspond to regions where the narrow lower portions of the tapered openings 24 within the upper deck meet the wide upper portions of the tapered openings 24 within the lower deck. In other embodiments, the inter-deck inflections may have other configurations in addition to, or alternatively to, the illustrated configuration of FIG. 5A-1. For instance, the inter-deck inflections may correspond to regions where the openings within the upper deck are misaligned relative to the openings within the lower deck.

The inter-deck inflections are not shown in FIGS. 5A and 5B in order to simplify by the drawings, but it is to be understood that inter-deck inflections may be present in some applications.

Figure 6:
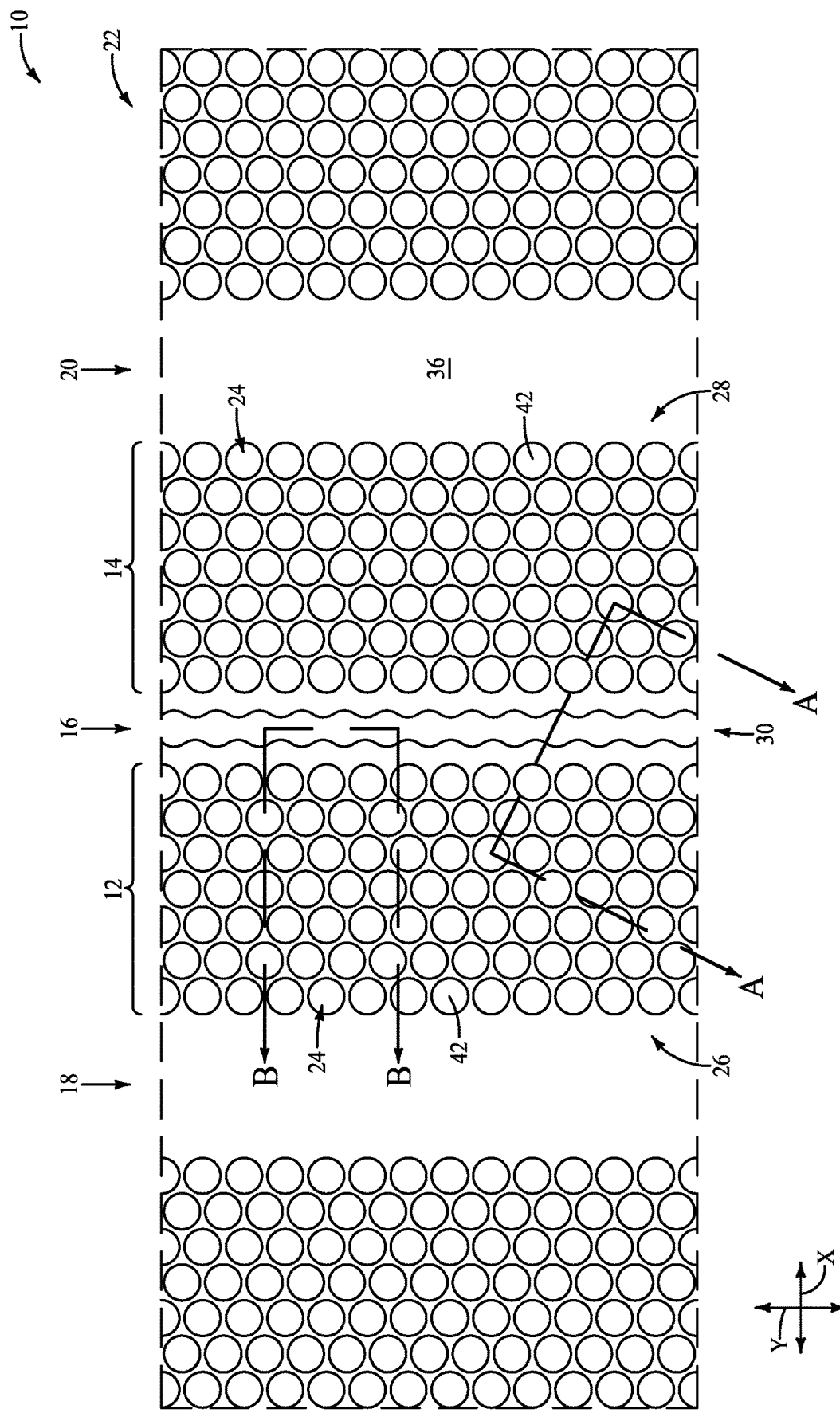
FIGS. 6-6B are views of an integrated assembly at an example process stage which may follow that of FIGS. 5-5B.
Figure 6A:
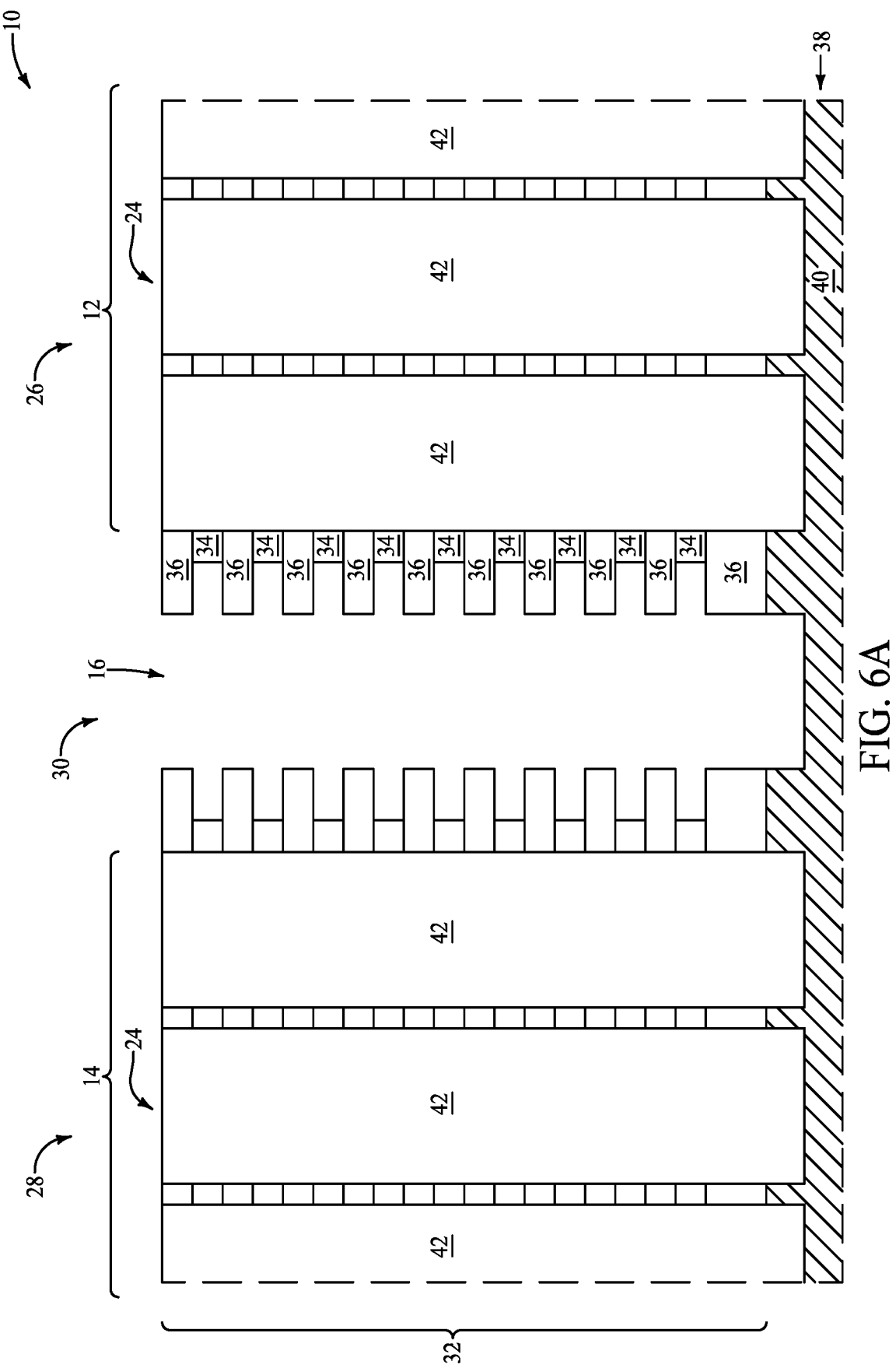
Figure 6B:
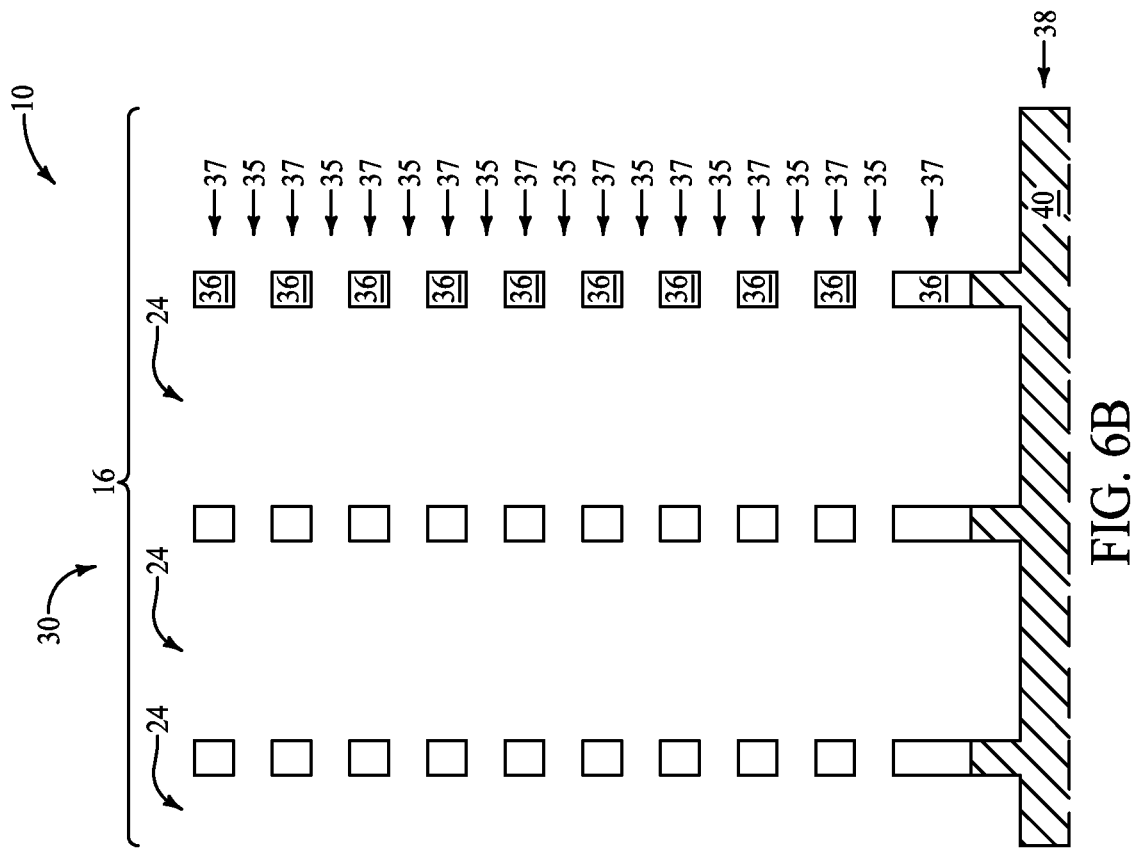
Figure 6B:
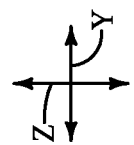

Referring to FIGS. 6-6B, the sacrificial material 42 is removed from the openings 24 of the linear string 30 within the separator-structure-region 16, and remains within the openings 24 of the arrays 26 and 28 within the memory-block-regions 12 and 14 to protect interior regions of the openings 24 within the memory-block-regions. After the sacrificial material 42 is removed from within the openings 24 of the linear string 30, the first material 34 is recessed from the exposed interior regions of the openings 24 of the linear string 30 to merge the openings 24 of the linear string 30 with one another along the first direction (the illustrated y-axis direction). FIG. 6B shows voids within the first levels 35 along the illustrated y-axis direction of the linear string 30.

The top view of FIG. 6 diagrammatically illustrates the merged openings 30 in dashed-line (phantom) view, as the merged portions of the openings 30 are under the top layer 36 (as can be understood relative to the side view of FIG. 6B).

Figure 7A:
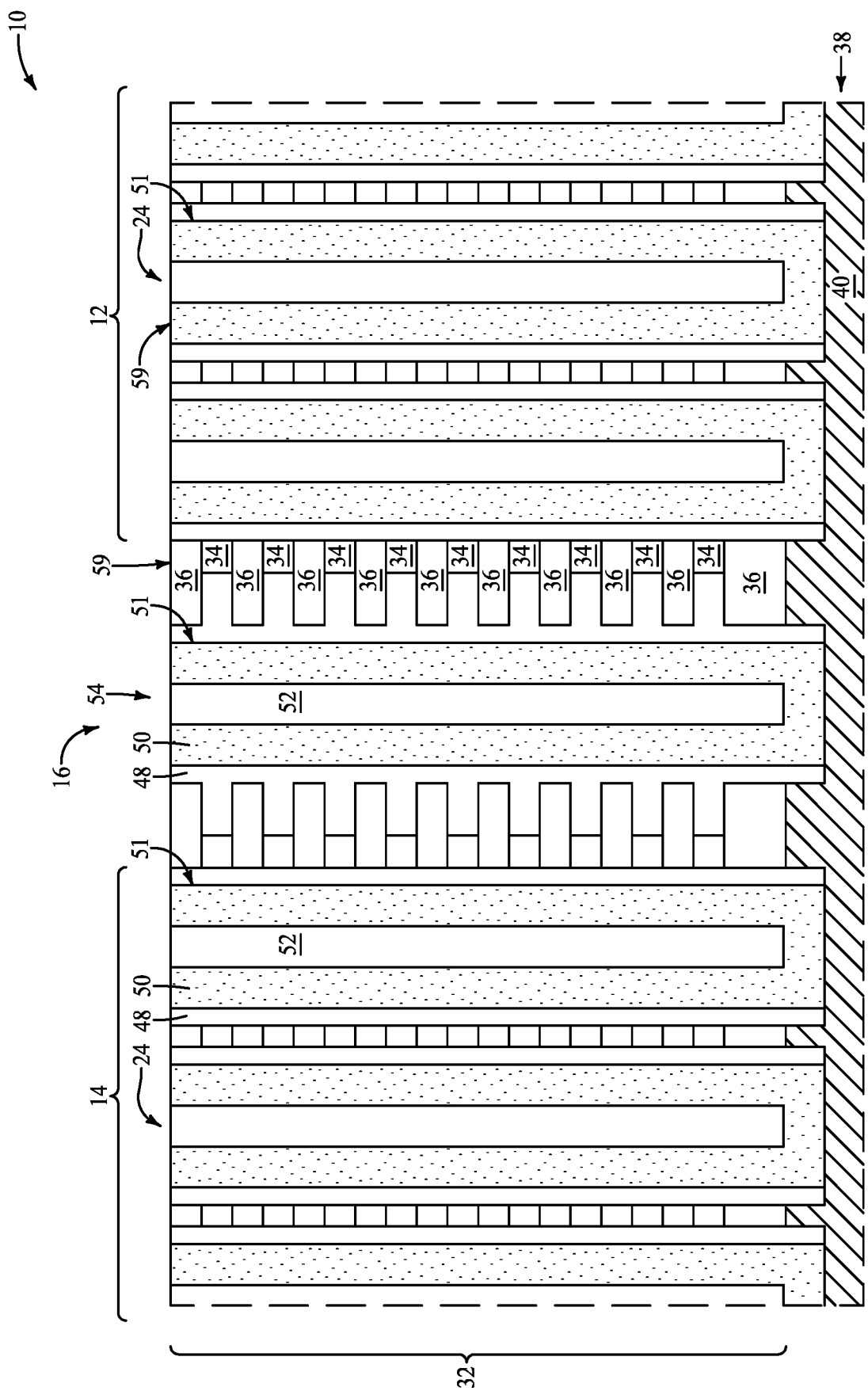
Figure 7B:
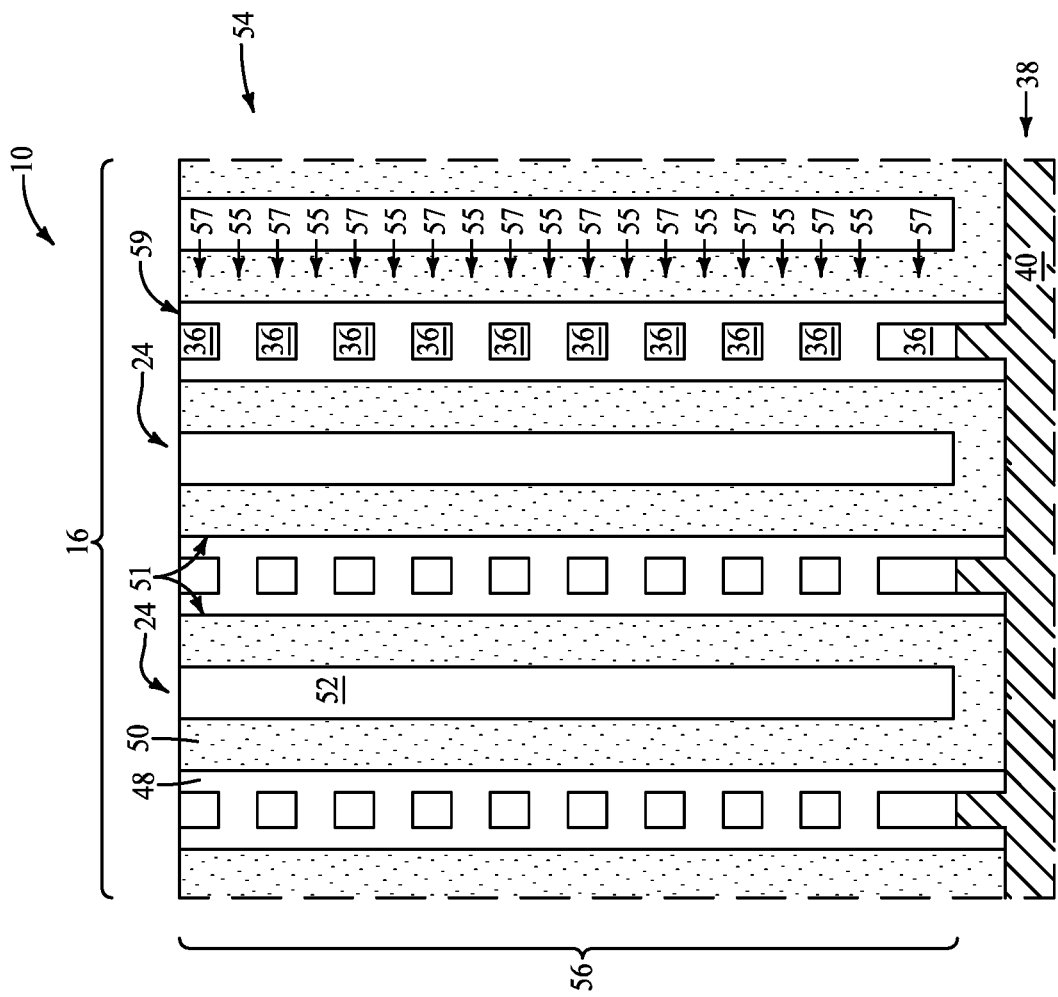

Referring to FIGS. 7-7B, the sacrificial material 42 (FIGS. 6 and 6A) is removed. Subsequently, materials 48, 50 and 52 are formed within the openings 24.

The material 50 is semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, the semiconductor material 50 may comprise, consist essentially of, or consist of silicon. The material 50 may be referred to as channel material, and may be considered to be configured as channel-material-pillars 51. The material 50 is illustrated with stippling to assist the reader in identifying such material.

The channel-material-pillars 51 are shown to be hollow, and to laterally surround the material 52. The material 52 is insulative, and may comprise any suitable composition(s). In some embodiments, the material 52 may comprise, consist essentially of, or consist of silicon dioxide. Although the channel-material-pillars 51 are shown to be hollow, in other embodiments the channel-material-pillars may be solid, and accordingly the material 52 may be omitted.

The channel material 50 is laterally offset from the materials 34 and 36 of the stack 32 by the cell material 48. The cell material 48 may comprise a laminate comprising multiple compositions suitable for incorporation into memory cells. For instance, in some embodiments the cell material 48 may comprise gate dielectric material (tunneling material) adjacent the channel material 50, charge-storage material adjacent the tunneling material, and charge-blocking material adjacent the charge-trapping material. The charge-blocking material may be directly against the materials 34 and 36 of the stack 32.

The gate dielectric material may comprise any suitable composition(s); and in some embodiments may comprise one or more of silicon dioxide, silicon nitride, aluminum oxide, hafnium oxide, zirconium oxide, etc. In some embodiments, the gate dielectric material may comprise a bandgap-engineered laminate.

The charge-storage material may comprise any suitable composition(s), and in some embodiments may comprise charge-trapping material (e.g., one or more of silicon nitride, silicon oxynitride, conductive nanodots, etc.).

The charge-blocking material may comprise any suitable composition(s), and in some embodiments may comprise one or both of silicon dioxide and silicon oxynitride.

In some embodiments, the channel material 50 may be considered to be a cell material.

The cell materials 48 and 50 within the separator-structure-region 16 are incorporated into a separator structure 54. The separator structure 54 of FIGS. 7-7B may be considered to include the channel-material-pillars 51, the insulative material 52, and a second stack 56 adjacent the channel-material-pillars 51. The second stack 56 comprises alternating first and second insulative levels 55 and 57. The second insulative levels 57 comprise the second material 36 of the first stack 32 described above with reference to FIGS. 5-5B. The first insulative levels 55 comprise one or more of the tunneling material, the charge-trapping material and the charge-blocking material of the cell material 48. In some embodiments, the openings 24 and levels 55 of the separator structure 54 may be filled with other materials either in addition to, or alternatively to, the materials 48, 50 and 52. For instance, insulative material may be formed within the openings 24 and the levels 57 of the separator structure 54 instead of forming the various materials 48, 50 and 52 within the separator structure. The insulative material may comprise any suitable composition(s), including, for example, one or more of silicon dioxide and various high-k compositions. Example high-k compositions are aluminum oxide, hafnium oxide, zirconium oxide, etc.

Figure 7C:
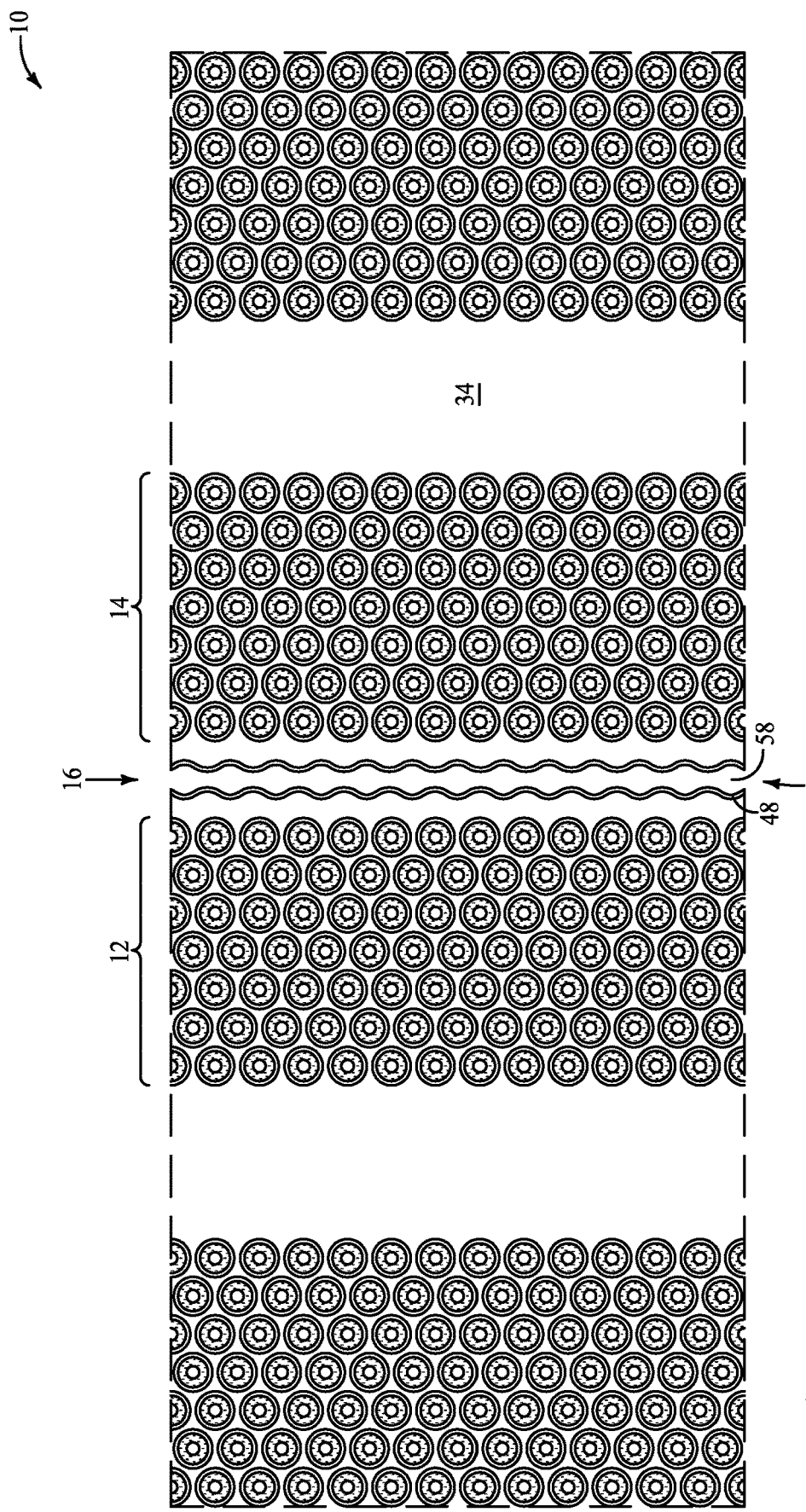
FIGS. 7C and 7D are diagrammatic top-down views of example integrated assemblies alternative to the assembly of FIG. 7.
Figure 7D:
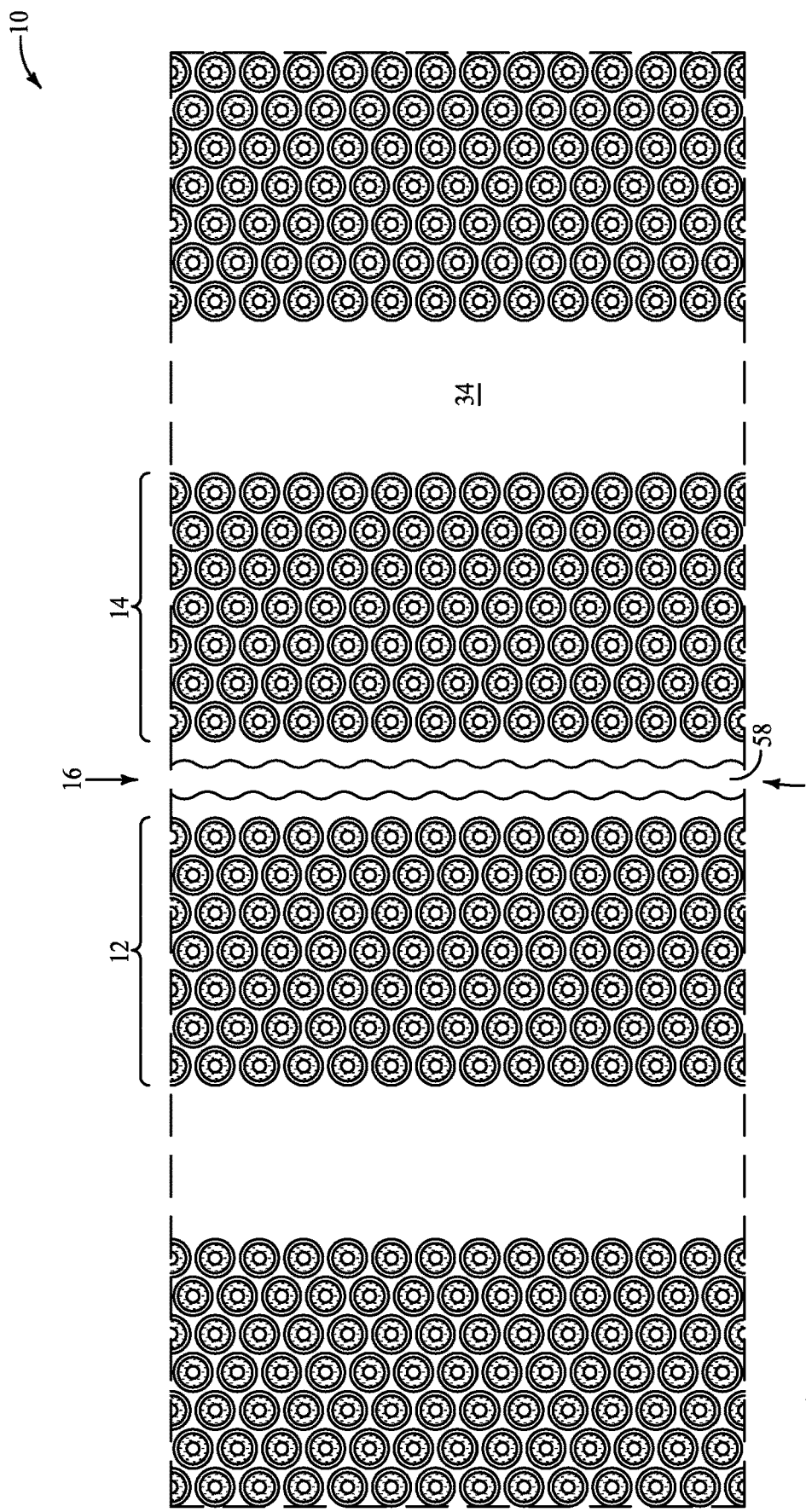

FIGS. 7C and 7D are top views of the assembly 10 analogous to the view of FIG. 7 from uppermost first tier 35 of first material 34, and show configurations in which the separator structure 54 is filled with the cell material 48 and a second insulative material 58 (FIG. 7C), or with only the second insulative material 58 (FIG. 7D). The second insulative material 58 may comprise any suitable composition(s), including, for example, one or more of silicon dioxide and various high-k compositions.

Referring again to FIGS. 7A and 7B, a planarized surface 59 is formed to extend across an upper surface of the assembly 10. The planarized surface 59 may be formed with any suitable processing, including, for example, chemical-mechanical polishing (CMP).

Figure 8:
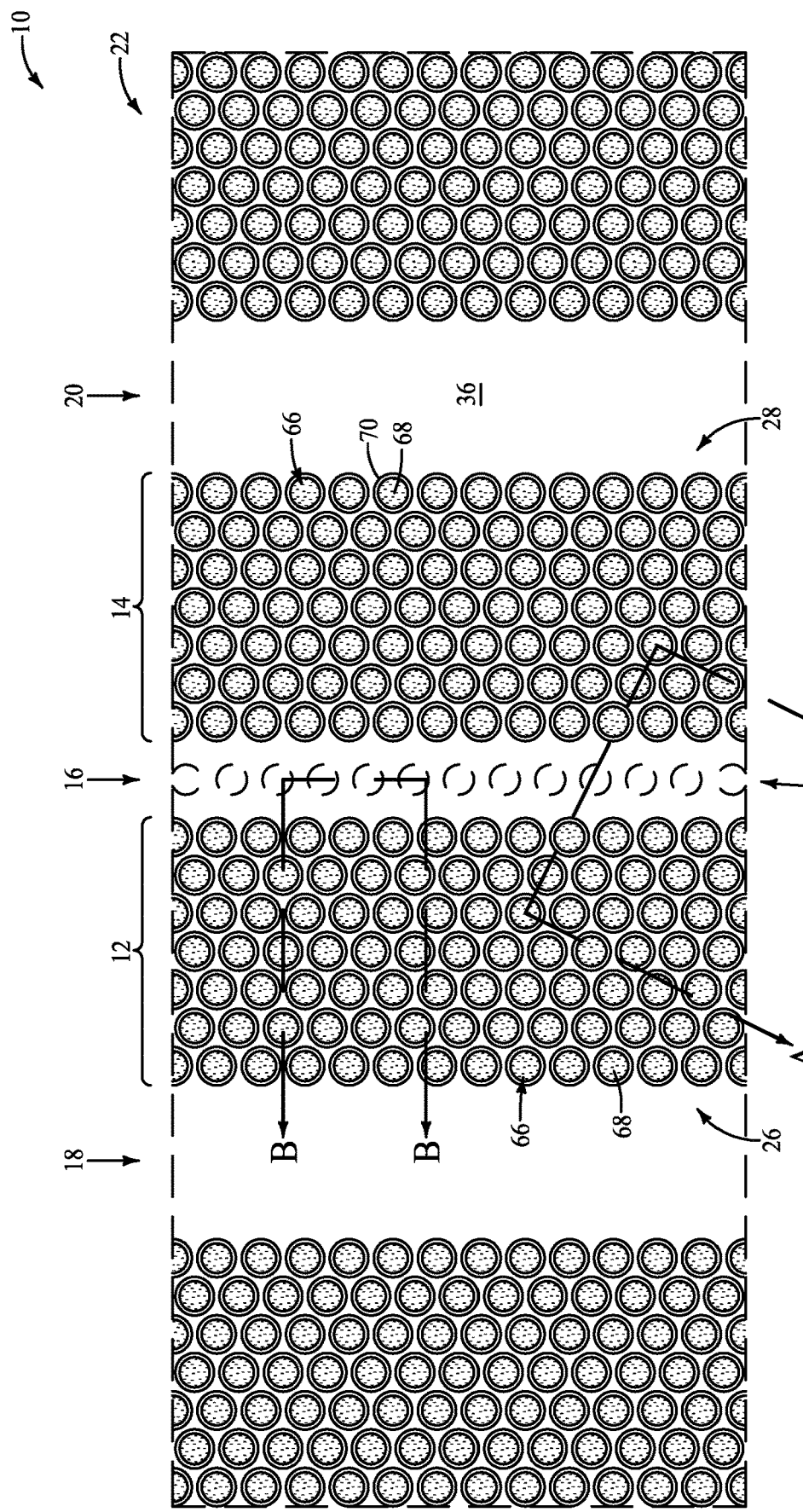

Referring to FIGS. 8-8B, a stack 60 is formed over the planarized surface 59. The stack 60 includes the alternating first and second materials 34 and 36 described above relative to the stack 32. The stack 60 may be referred to as a third stack to distinguish it from the first and second stacks 32 and 56 described above.

The third stack 60 comprises alternating first and second levels 62 and 64. The sacrificial material 34 of the first levels 62 is eventually replaced with conductive material to form conductive lines extending to drain-side select gate (SGD) structures. There may be any suitable number of the levels 62 to establish the desired number of conductive lines extending to the SGD structures.

Upper channel structures 66 are formed to extend through the stack 60 to upper surfaces of the channel-material-pillars 51. The upper channel structures 66 comprise conductive material 68, which in the shown embodiment comprises semiconductor material (as indicated with stippling). The semiconductor material 68 may comprise conductively-doped silicon in some embodiments. In other embodiments, the upper channel structures 66 may comprise other conductive materials, either in addition to, or alternatively to, the semiconductor material. Such other materials may include, for example, metals and/or metal-containing compositions. Upper channel structures 66 can be hollow and can be filling with insulative material 52. An upper region 69 of the upper channel structures can comprise, for example a semiconductor material that is more heavily doped than the remainder of material 68.

The conductive material 68 of the upper channel structures 66 is spaced from the materials 34 and 36 of the stack 60 by insulative material 70. The insulative material 70 may comprise any suitable composition(s), and in some embodiments may comprise, consist essentially of, or consist of silicon dioxide.

Figure 8A:
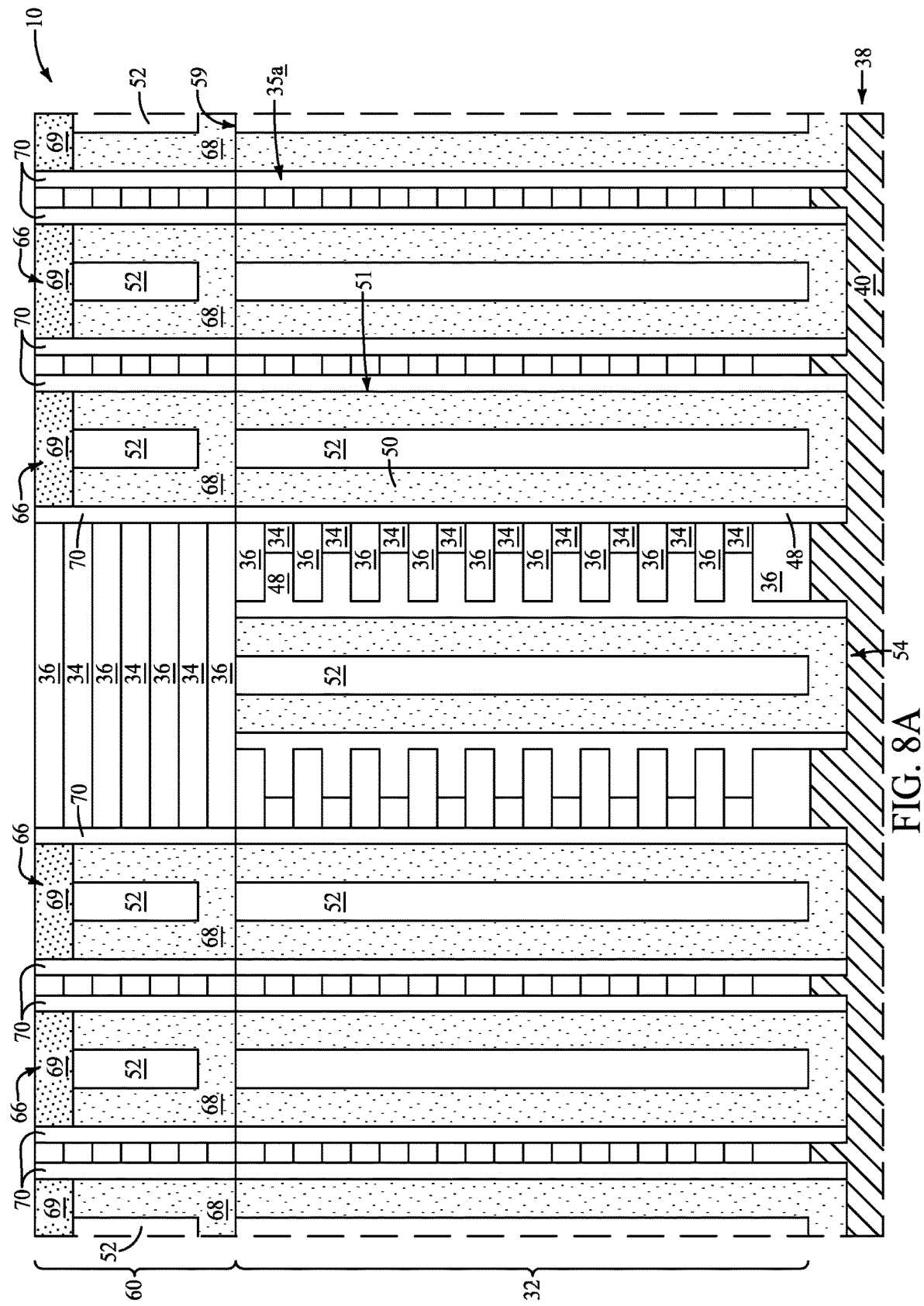

The separator structure 54 is under the stack 60, as shown in FIGS. 8A and 8B. The separator structure 54 is diagrammatically illustrated in FIG. 8 with dashed-line circles. The dashed-line view is utilized to indicate that the separator structure 54 is under other materials (specifically, the stack 60). The circles are utilized to diagrammatically indicate that the separator structure 54 is formed of merged openings (with such formation being described above with reference to FIGS. 5 and 6).

Figure 9:
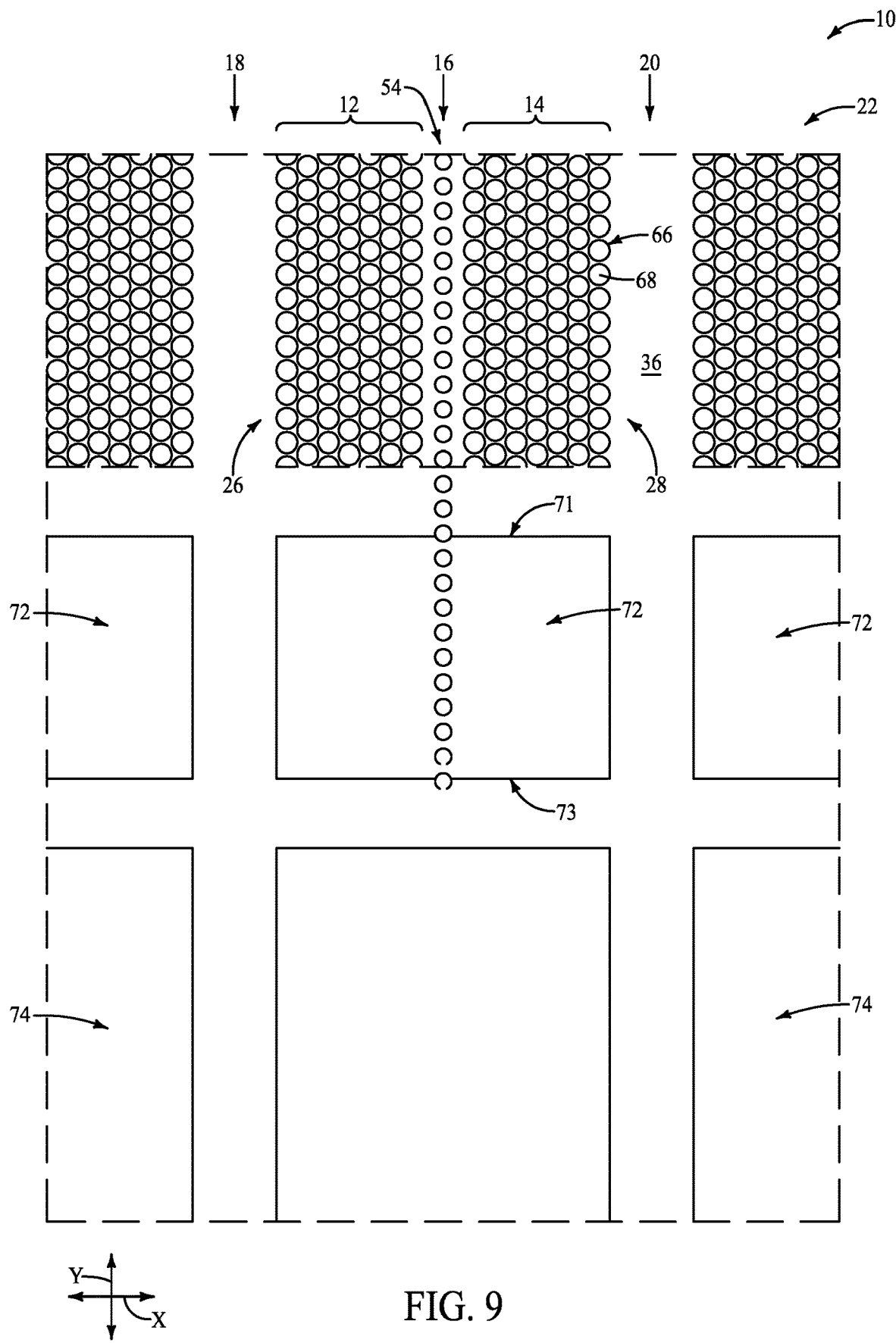
FIG. 9 is a diagrammatic top-down view of an example integrated assembly at the process stage of FIG. 8.

Referring to FIG. 9, the memory array region 22 of FIG. 8 is shown to be part of a larger assembly which includes SGD staircase locations 72 and wordline staircase locations 74. In some embodiments, wordlines may be referred to as routing structures, and accordingly the staircase locations 74 may be referred to as routing-structure-staircase-locations. Due to size constraints in depicting the larger assembly, FIG. 9 (and subsequent FIGS. 10-13) omit fine detail within the array region for clarity (e.g. some shading and material demarcations within openings 24). Such details can be understood with references back to FIG. 8.

Solid lines are utilized to indicate boundaries around the locations 72 and 74 for purposes of illustration. It is to be understood that the locations 72 and 74 may not be yet patterned at the process stage of FIG. 9.

The slit locations 18 and 20 extend along the entirety of the region of the assembly 10 shown in FIG. 9, and thus pass between SGD staircase locations 72 and wordline staircase locations 74.

The separator-structure-location 16 is shown to extend into an SGD staircase location 72, and in the illustrated embodiment passes entirely across the SGD staircase location. Accordingly, the separator structure 54 passes through the memory array region 22 and across the SGD staircase location 72. The SGD staircase location is shown to have a front edge 71 adjacent the memory array region 22, and to have a back edge 73 in opposing relation to the front edge 71. In the illustrated embodiment, the separator structure 54 passes from the front edge 71 to the back edge 73.

Figure 10:
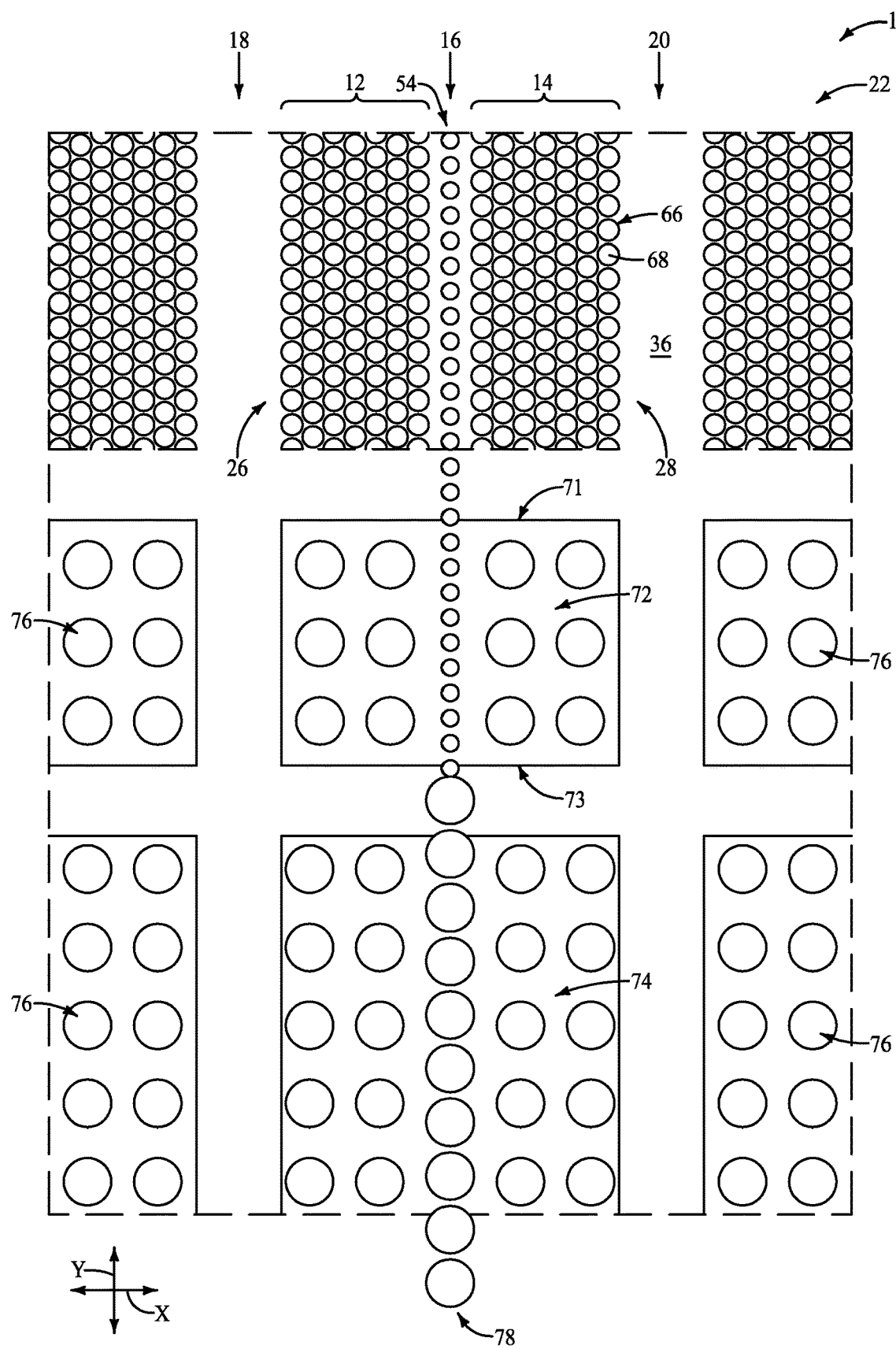
FIG. 10 is a diagrammatic top-down view of an example integrated assembly at an example process stage which may follow the process stage of FIG. 9.

Referring to FIG. 10, openings 76 are patterned through the stacks 60 and 32 (FIG. 8A) within the staircase regions 72 and 74. Eventually, support structures are formed within the openings 76, and accordingly the openings 76 may be referred to as support-structure-openings.

A series of the support-structure-openings 76 is provided within the separator-structure-region 16. Such series is configured as a linear string 78 of the support-structure-openings. The linear string 78 extends along the y-axis direction, and extends from an end of the support structure 54 along the back edge 73 of the SGD staircase region 72.

Figure 11:
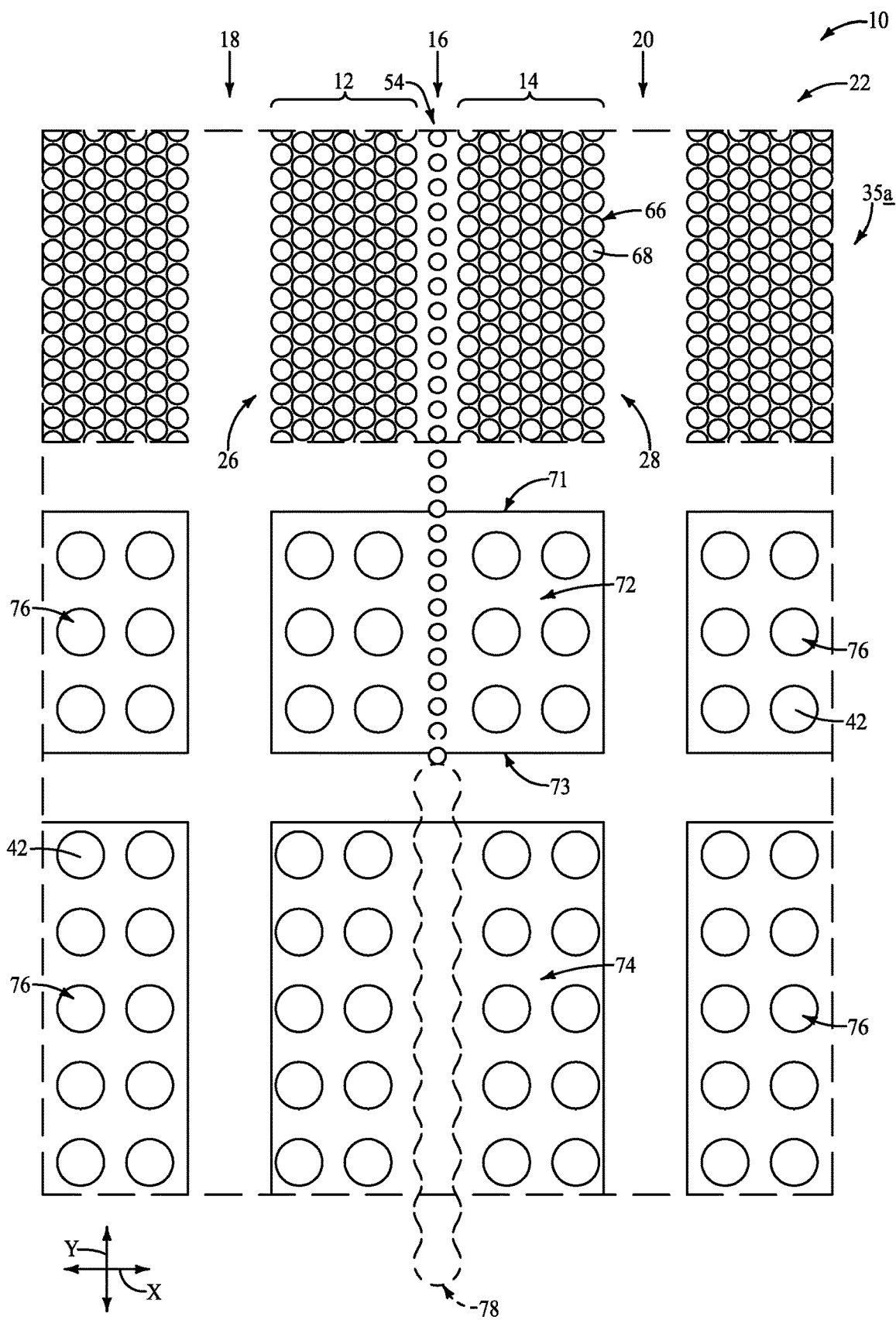
FIG. 11 is a diagrammatic top-down view of an example integrated assembly at an example process stage which may follow the process stage of FIG. 10.

Referring to FIG. 11, sacrificial material 42 protects the openings 76 that are not part of the linear string 78, while interior regions of the openings 76 within the linear string 78 are exposed to etching which recesses the first material 34 (FIGS. 8A and 8B) analogous to the recessing described above with reference to FIGS. 6-6B. The recessing of the material 34 causes the openings 76 of the linear string 78 to merge with one another along the first direction (the illustrated y-axis direction). The top view of FIG. 11 diagrammatically illustrates the merged openings 76 in dashed-line (phantom) view, as the merged portions of the openings 76 are under the top layer 36 (as can be understood relative to the side views of FIGS. 8A and 8B).

Figure 11A:
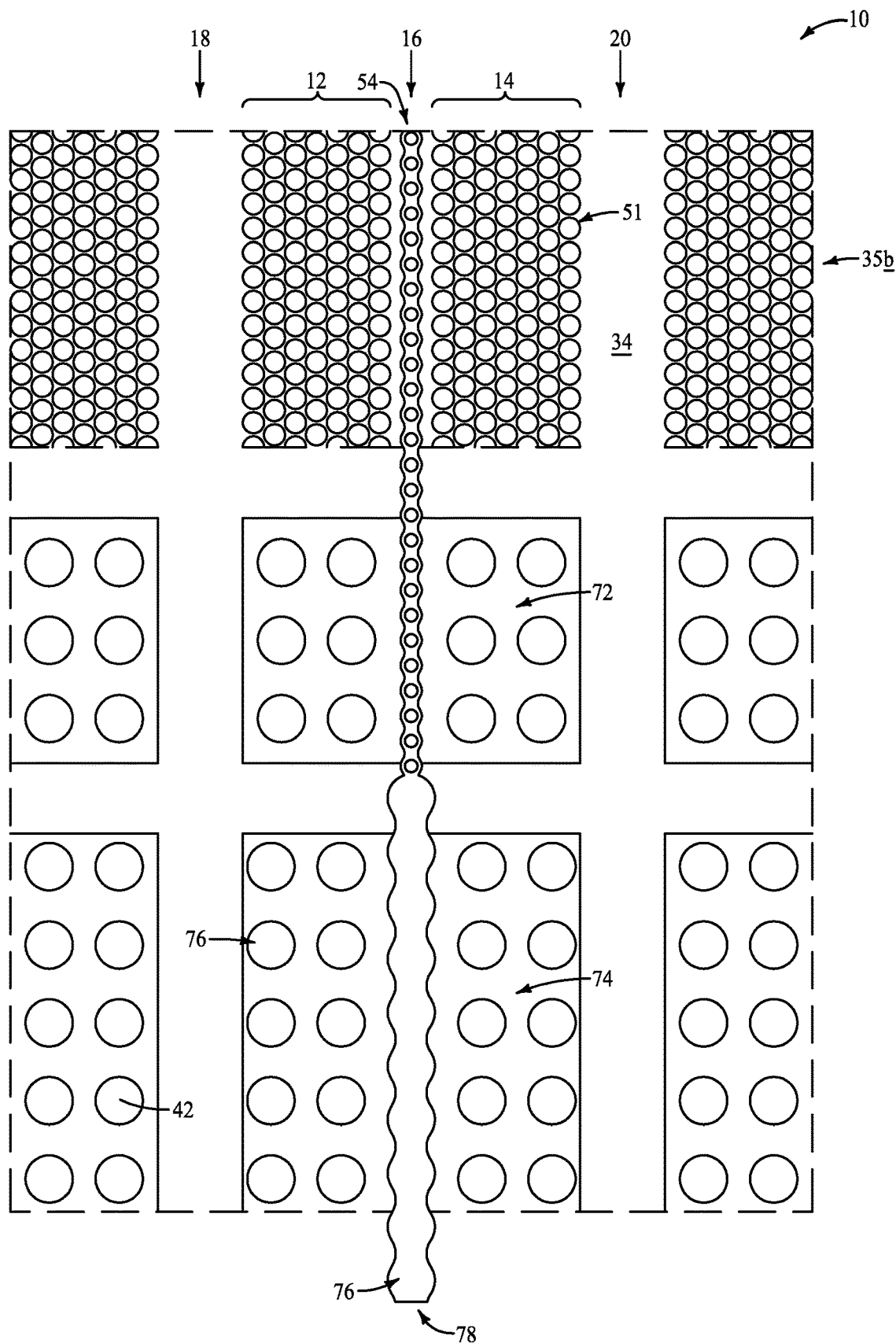
FIG. 11A is a diagrammatic top-down sectional view of the assembly of FIG. 11.

FIG. 11A shows the same assembly 10 as shown in FIG. 11, but shows the assembly along a level identified as 35a in FIG. 8A (i.e., shows the assembly along one of the levels having recessed material 34). The merger of the openings 76 along the linear string 78 is clearly visible along the view of FIG. 11A.

Figure 12:
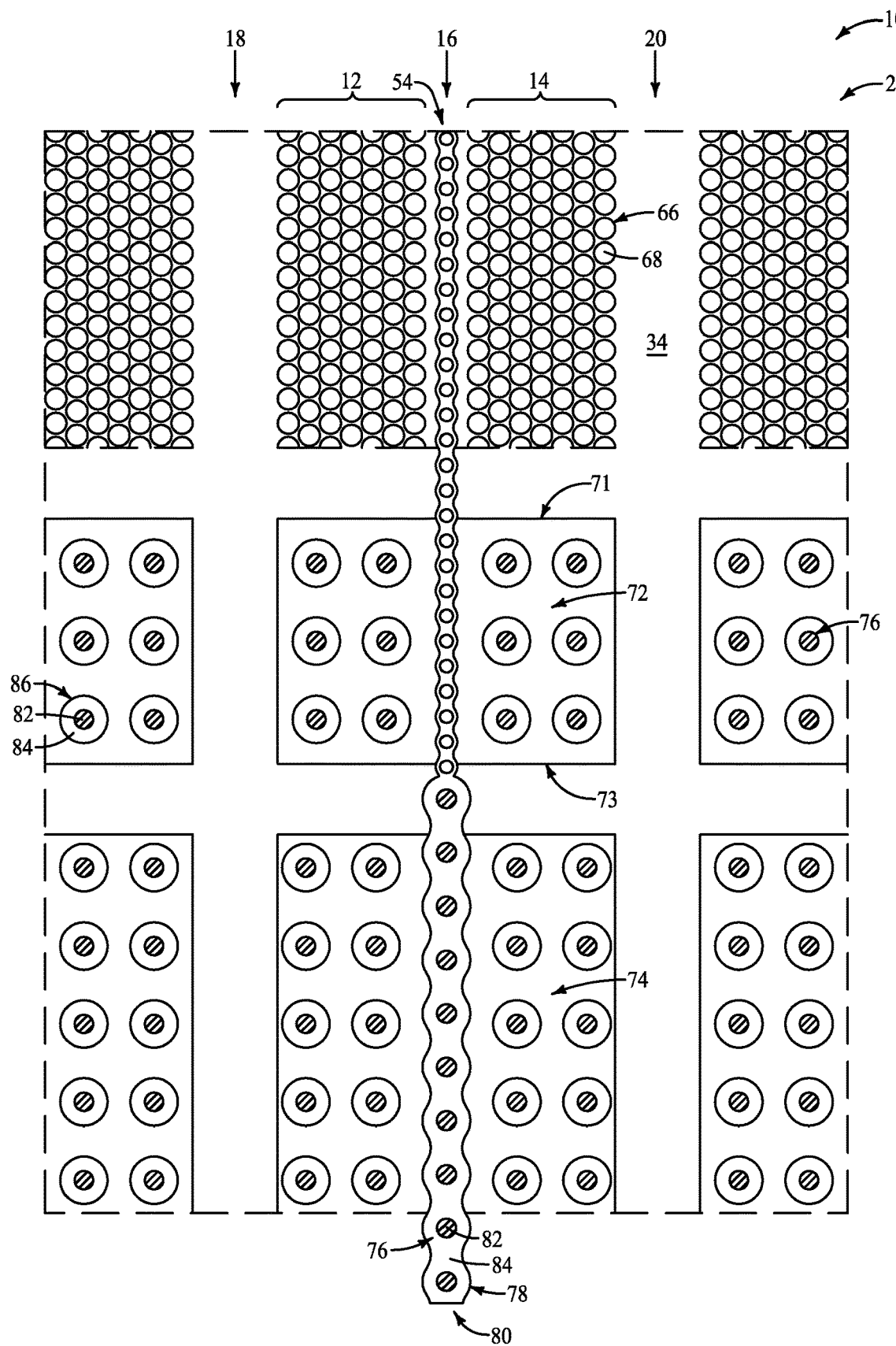
FIG. 12 is a diagrammatic top-down view of an example integrated assembly at an example process stage which may follow the process stage of FIG. 11.

Referring to FIG. 12, the sacrificial material 42 is removed from the openings 76, and then support materials 82 and 84 are formed within the openings to form support structures 86. In the illustrated embodiment, the support material 82 is electrically conductive, and the support material 84 is electrically insulative. In other embodiments, the support structures 86 may only comprise one or more electrically insulative materials. In the illustrated embodiment in which the central support material is electrically conductive, such material may extend to regions associated with the conductive structure 38 (FIG. 5A). The conductive material 82 of the support structures 86 may or may not be utilized as electrical interconnects extending to conductive regions electrically coupled with the conductive material 40 of the structure 38. If the conductive material 82 of the support structures 86 is utilized as electrical interconnects, the support structures may be referred to as "live" structures. In contrast, if the conductive material 82 is not utilized as electrical interconnects, the support structures may be referred to as "dummy" structures to indicate that they serve a support role only rather than also being incorporated into functional electrical circuits.

The materials 84 and 82 are also formed within the merged openings 76 of the linear string 78. The materials 84 and 82 within the merged openings 76 are incorporated into a separator structure 80. The separator structure 80 extends across the staircase region 74.

The separator structures 54 and 80 may both serve a common purpose of separating a first block region 12 from a second block region 14, and are joined to one another. In the illustrated embodiment, the separator structure 54 is narrower than the separator structure 80. The separator structure 54 extends across the memory array region 22 and the SGD staircase region 72, and the separator structure 80 extends across the wordline staircase region 74.

Figure 13:
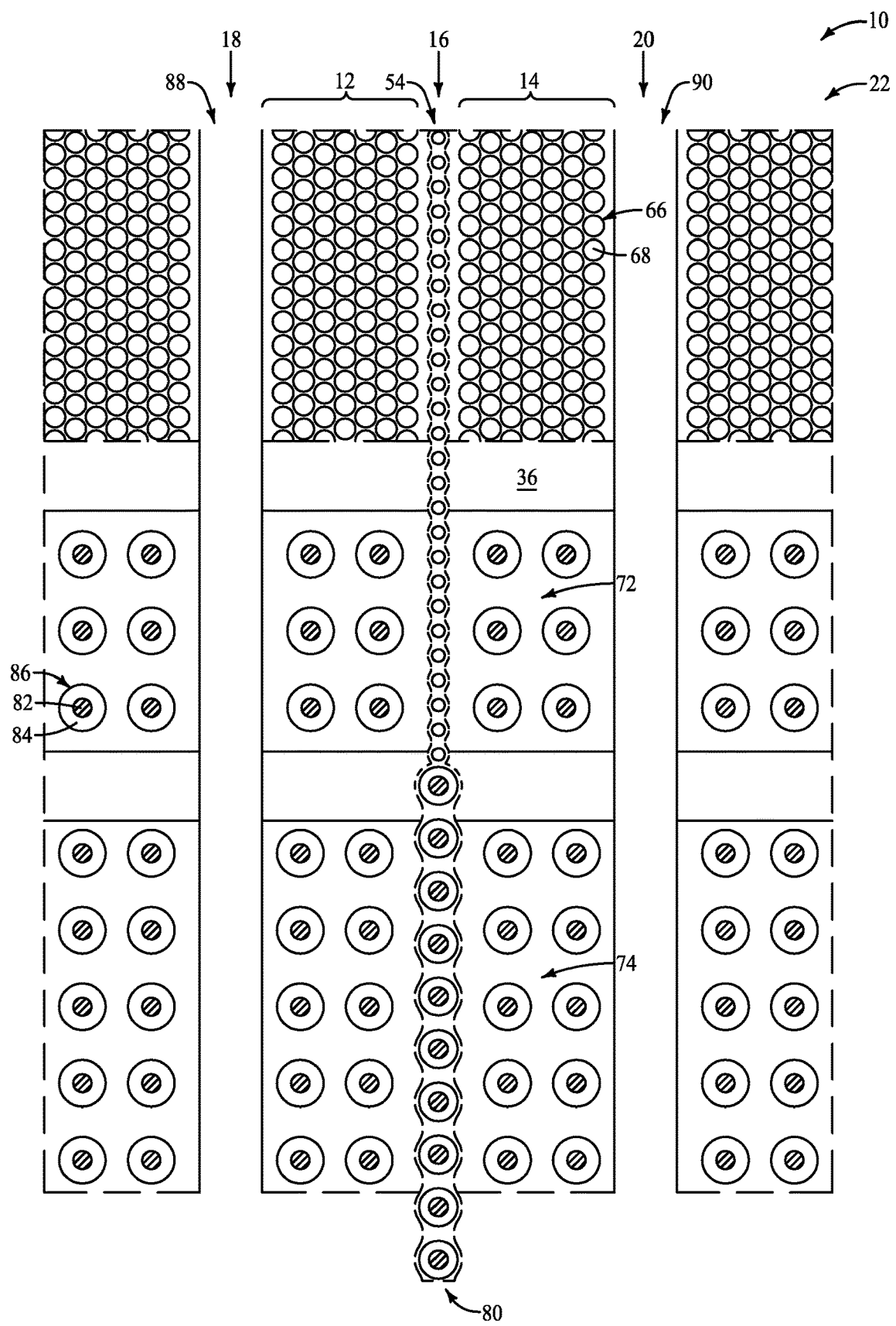
FIG. 13 is a diagrammatic top-down view of an example integrated assembly at an example process stage which may follow the process stage of FIG. 12.

Referring to FIG. 13, slits 88 and 90 are formed within the slit locations 18 and 20, respectively. FIG. 13A shows a portion of the slit 88 within the slit location 18, and shows that such slit passes through the stacks 32 and 60, and to an upper surface of the conductive structure 38. In some embodiments, the slits 88 and 90 may be formed to penetrate into the conductive structure 38 rather than stopping at an upper surface of such conductive structure.

In some embodiments, the slit 88 may be referred to as a first slit, with such first slit being on an opposing side of the first memory-block-region 12 from the separator structure 54; and the slit 90 may be referred to as a second slit, with such second slit being on an opposing side of the second memory-block-region 14 from the separator structure 54.

The memory-block-regions 12 and 14 are associated with the memory array region 22. However, the slits 18 and 20 extend beyond the memory-block-region 12, and extend along the SGD staircase region 72 and the wordline staircase region 74.

Figure 14:
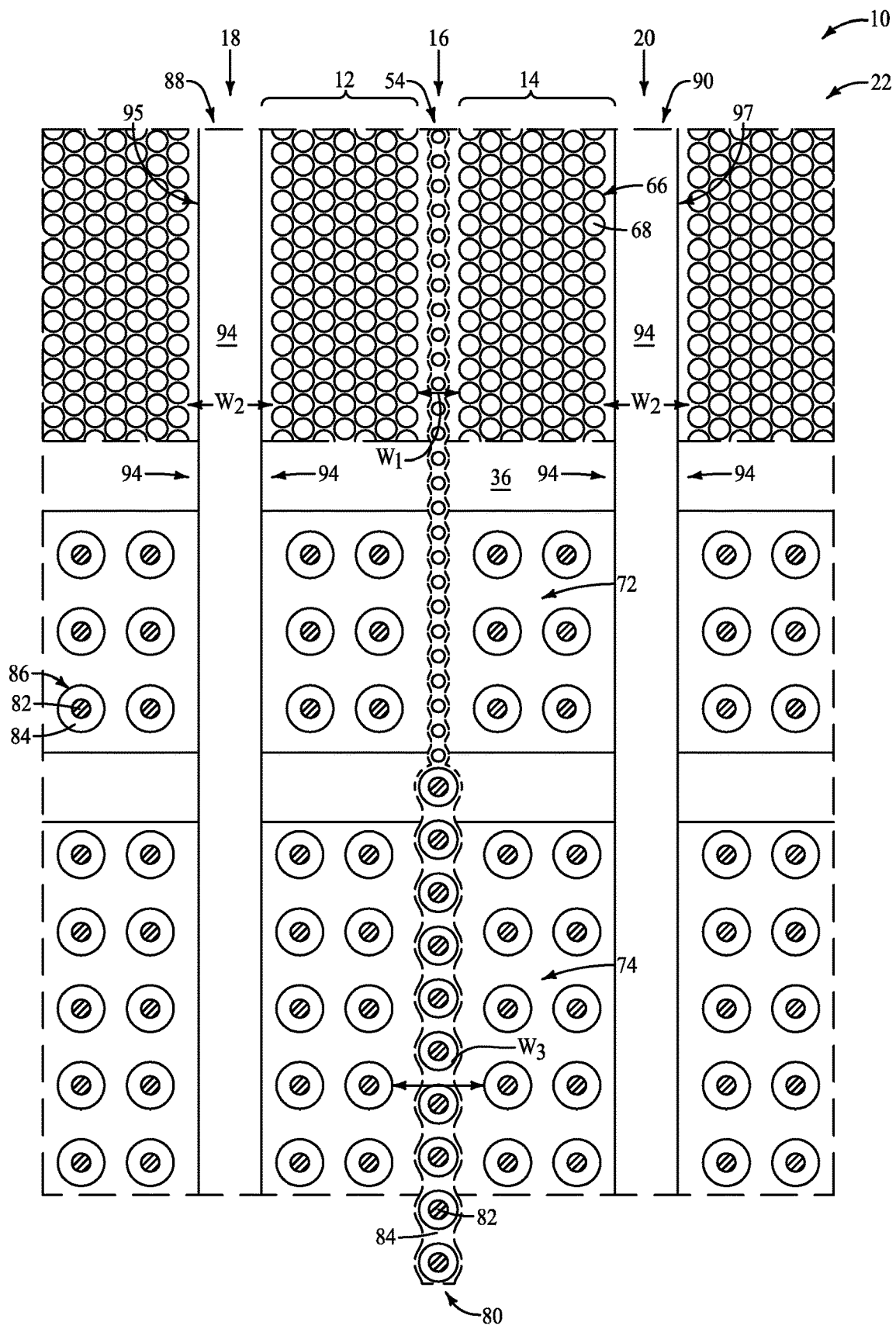
FIG. 14 is a diagrammatic top-down view of an example integrated assembly at an example process stage which may follow the process stage of FIG. 13.
Figure 14A:
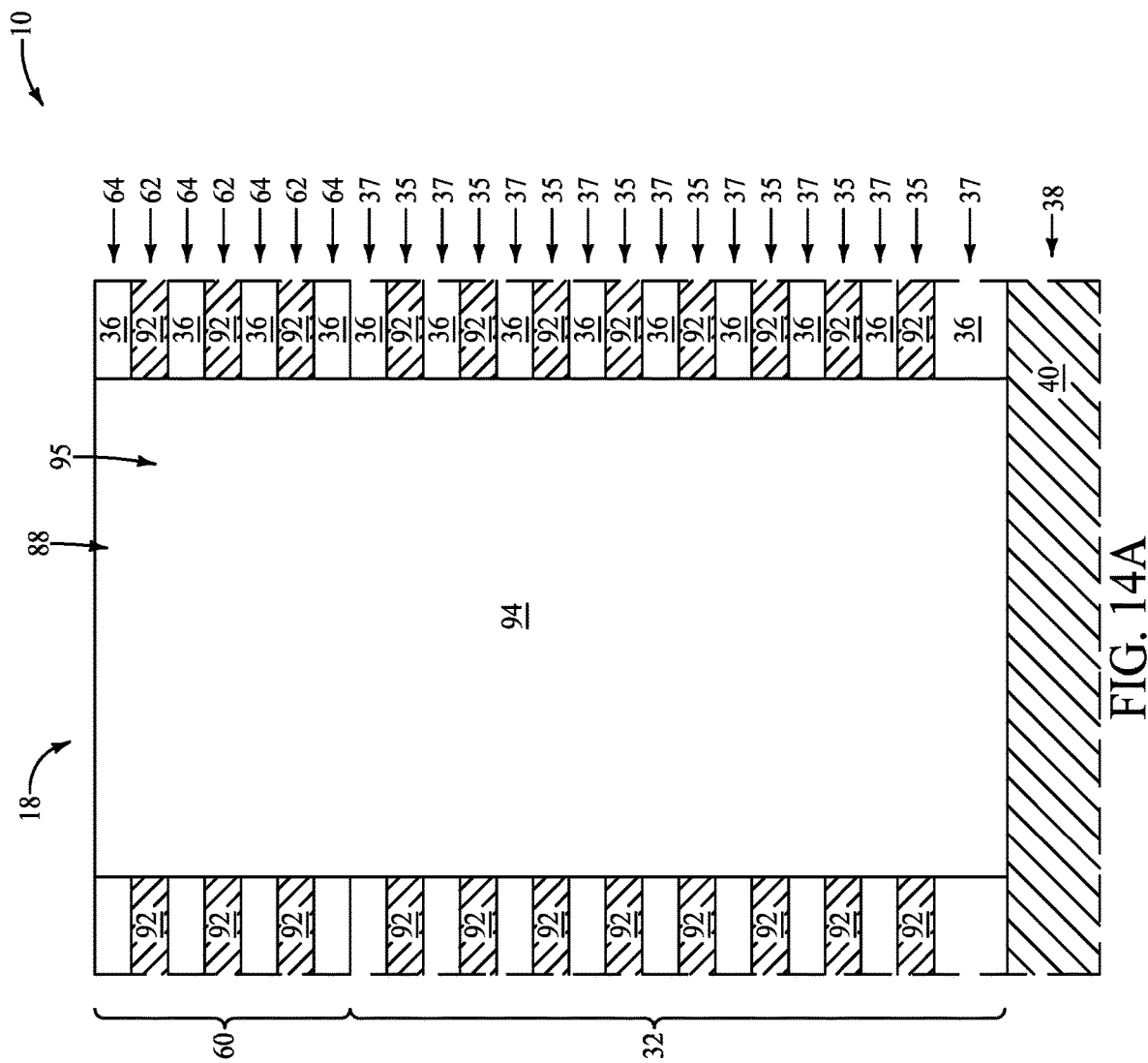
FIGS. 14A-C are diagrammatic cross-sectional side views of regions of the assembly of FIG. 14.
Figure 14B:
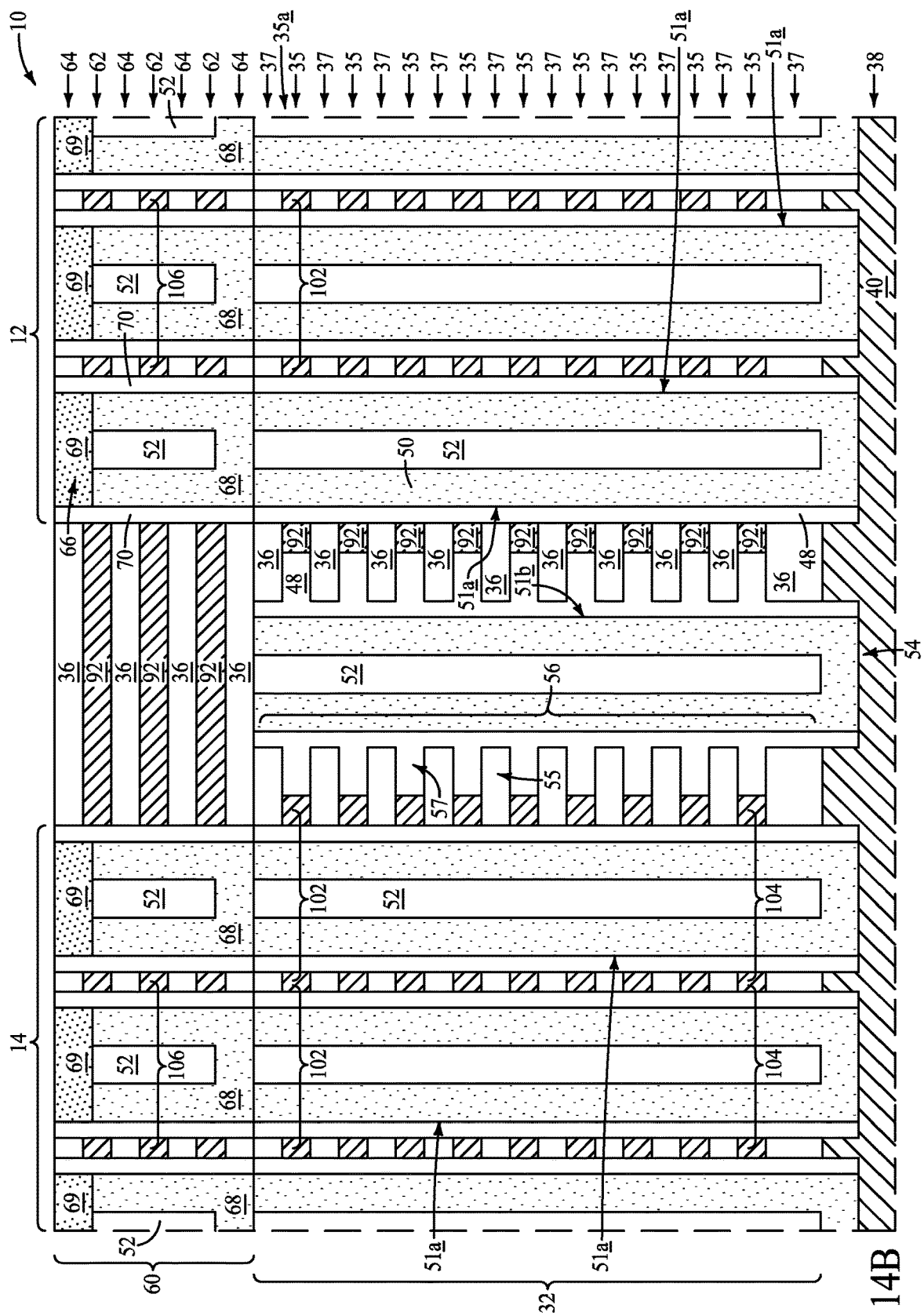
Figure 14C:
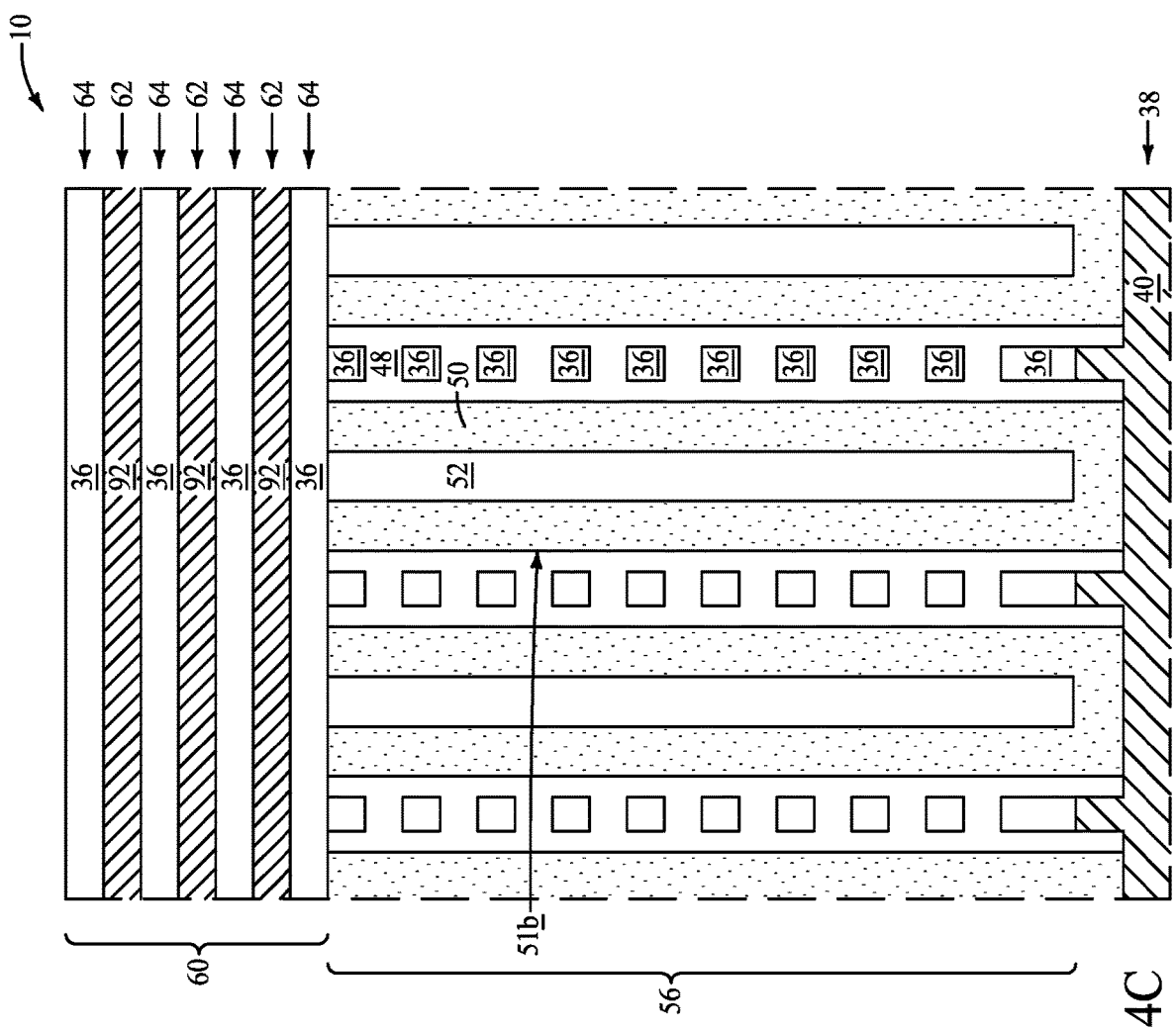

FIGS. 14-14C show the assembly 10 at a process stage subsequent to that of FIGS. 13 and 13A. The view of FIG. 14 is a top view analogous to that of FIG. 13, the view of FIG. 14A is a side view along the slit region 18 analogous to the view of FIG. 13A, and the views of FIGS. 14B and 14C are analogous to the views of FIGS. 8A and 8B, respectively.

The sacrificial material 34 (FIGS. 8A and 13A) is removed with etchant flowed into the slits 88 and 90 to leave voids vertically between the levels comprising the instant material 36. Subsequently, conductive material 92 is deposited within such voids to form conductive levels 35 within the stack 32, and to form conductive levels 62 within the stack 60. The conductive levels 35 alternate with the insulative levels 37 within the stack 32, and the conductive levels 62 alternate with insulative levels 64 within the stack 60. The conductive levels 35 within the stack 32 may be referred to as wordline levels (routing levels, memory cell levels, etc.), and the conductive levels 62 within the stack 60 may be referred to as SGD levels (second routing levels, select gate levels, etc.).

In some embodiments, the insulative levels 37 of the stack 32 may be referred to as first in some levels, and the insulative levels 57 and 55 of the stack 56 may be referred to as second and third in some levels, respectively. The conductive material 92 within the conductive levels 35 of the stack 32 is substantially horizontally-aligned with the second insulative levels 57 within the stack 56 of the separator region 54, as shown in FIG. 14B. Also, the first insulative levels 35 of the stack 32 are substantially horizontally-aligned with the third insulative levels 55 of the stack 56. The term "substantially horizontally-aligned" means horizontally-aligned to within reasonable tolerances of fabrication and measurement.

In some embodiments, the channel-material-pillars 51 within the memory-block-regions 12 and 14 may be referred to as first channel-material-pillars 51a (shown in FIG. 14B), and the channel-material-pillars within the separator structure 54 may be referred to as second channel-material-pillars 51b (shown in FIG. 14B). The first and second channel-material-pillars 51a and 51b extend through the stacks 32 and 56, respectively, and are electrically coupled with the conductive structure 38. Specifically, in the embodiment of FIG. 14B the pillars 51a and 51b are directly against the conductive structure 38.

The conductive material 92 may comprise any suitable composition(s). In some embodiments, the conductive material 92 may comprise, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 92 may comprise a metal core (e.g., a core comprising tungsten, titanium, etc.), and a metal-nitride-containing liner along peripheral edges of the metal core. The metal-nitride-containing liner may comprise, for example, one or both of tungsten nitride and titanium nitride. In some embodiments, high-k material (e.g., aluminum oxide, hafnium oxide, zirconium oxide, etc.) may be provided along outer peripheral edges of the conductive material within the levels 35. The high-k material may be utilized as dielectric barrier material within the memory cells, and may be provided between the conductive material 92 and the memory cell material 48. The dielectric barrier material is not shown in the drawings in order to simplify such drawings.

The replacement of the sacrificial material 34 with the conductive material 92 may be referred to as gate replacement methodology.

After the conductive material 92 is formed within the levels 35 and 62, the slits 88 and 90 may be filled with one or more appropriate materials. In the illustrated embodiment, the slits are filled with insulative material 94. The insulative material 94 forms panels 95 and 97 within the slit locations 18 and 20, respectively. In other embodiments, the panels 95 and 97 may have other configurations. For instance, such panels may comprise laminates having conductive material sandwiched between outer insulative materials.

The memory-block-regions 12 and 14 each have one side bounded by a slit (88 and 90), and another side bounded by the separator structure 54. The etchant and conductive material utilized for the gate replacement methodology is flowed through the slits 88 and 90 associated with the slit locations 18 and 20, and accordingly is flowed along only one side of the memory-block-regions 12 and 14. Similarly, the gate replacement methodology associated with the SGD staircase locations 72 and the wordline staircase locations 74 also has etchant flowed from only one side of a blocked region since a separator structure (54 or 80) is along the other side of the blocked region.

An advantage of the methodology described herein is that the separator structures (54 and 80) may be substantially narrower than the slits 88 and 90. For instance, in some embodiments the separator structure 54 may be considered to have a first width $W_1$, and the panels 95 and 97 may be considered to have second widths $W_2$. The second widths $W_2$ may be at least about 150% larger than the first width $W_1$. The separator structure 80 may be considered to have a third width $W_3$. The third width $W_3$ may be larger than the first width $W_1$, as shown; and may be less than or equal to the second width $W_2$. In the illustrated embodiment, the width $W_3$ of the separator structure 80 is larger than the width $W_2$ of the panels 95 and 97. Such is to simplify the drawings. In other embodiments, the width $W_3$ may be less than the width $W_2$.

Embodiments described herein advantageously enable tighter packing within the memory array region 22 (and possibly also within the staircase regions 72 and 74) than may be achieved by conventional methods in which slits are utilized instead of the structures 54 and 80.

Memory cells 102 (only some of which are labeled) are along the conductive levels 35 within the memory-block-regions 12 and 14, as shown in FIG. 14B. Also, SGS devices 104 (only some of which are labeled) are along the bottommost conductive level 35. In other embodiments, more than one of the lowermost levels 35 may be incorporated into the SGS devices.

The memory cells 102 and the SGS devices 104 comprise regions of the conductive levels 35, and comprise regions of the memory cell materials 50 and 48. In some embodiments, the memory cells 102 may correspond to vertically-stacked strings of memory cells associated with NAND memory.

The conductive levels 62 are incorporated into SGD devices 106 (only some of which are labeled). In some embodiments, bitlines (not shown) may be formed over the upper channel structures 66 of the SGD devices.

Figure 14D:
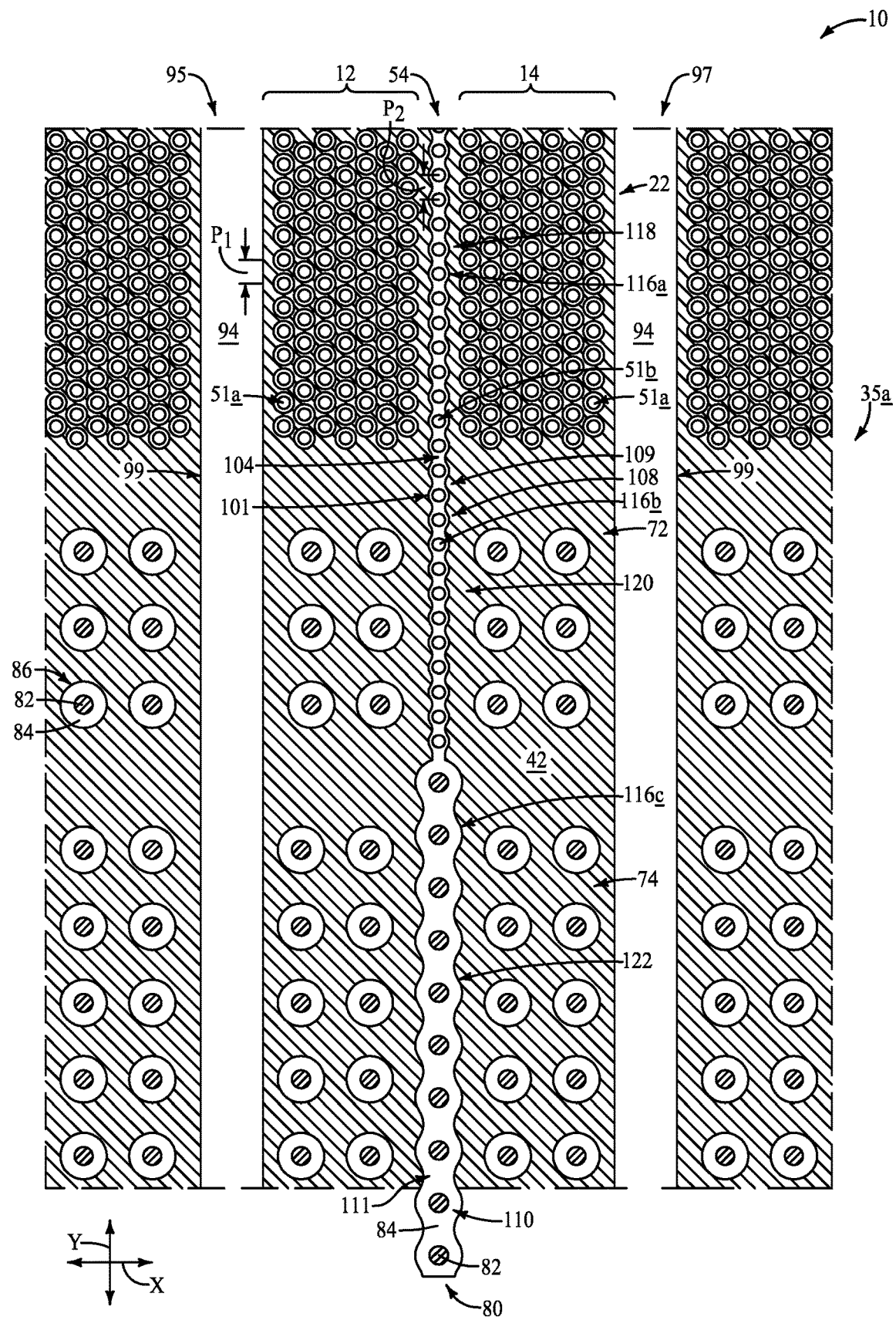
FIG. 14D is a diagrammatic top-down sectional view of the assembly of FIG. 14.

FIG. 14D shows a top-down section along a conductive level 35a of FIG. 14B. Such view more clearly illustrates the separator structures 54 and 80.

In some embodiments, the separator structures 54 and 80 may be together referred to as a single separator structure 54/80. In some embodiments, the panels 95 and 97 may be referred to as first and third separator structures, and the structure 54/80 may be referred to as a second separator structure. The illustrated first and third separator structures 95 and 97 have substantially straight sidewalls 99 which extend along the first direction (the y-axis direction). In contrast, the second separator structure 54/80 has serpentining sidewalls 101 (which also extend along the first direction). In the illustrated embodiment, the panels 95 and 97, and the separator structure 54/80, are substantially straight along the y-axis direction. In other embodiments, the panels and/or the separator structure may be curved, wavy, etc.

It is noted that the second stack 56 of FIGS. 14B and 14C is associated with the region 54 of the separator structure 54/80, and that another stack comprising the insulative material 84 is associated with the region 80 of the separator structure 54/80. In other words, the second stack 56 is associated with one region of the separator structure 54/84, and is not associated with a second region of the separator structure 54/84 which is laterally offset from the first region along the y-axis direction.

The separator structure 54/80 has first bulbous regions 108 within the region 54 of such separator structure, and has second bulbous regions 110 within the second region 80 of such structure. The first bulbous regions 108 alternate with narrow regions 109 along the first direction (y-axis direction), and the second bulbous regions 110 alternate with narrow regions 111 along the first direction. In the shown embodiment, the bulbous regions 110 are larger than (wider than) the bulbous regions 108. In some embodiments, the bulbous regions 110 may be at least about 10% larger than the bulbous regions 108, at least about 20% larger than the bulbous regions 108, at least about 50% larger than the bulbous regions 108, etc.

In some embodiments, the separator structure 54/80 may be considered to comprise a first region 118 within the memory array region 22 and between the memory-block-regions 12 and 14, to comprise a second region 120 within the SGD staircase region 72, and to comprise a third region 122 within the routing staircase region (wordline staircase region) 74. The bulbous regions within the first region 118 of the separator structure 54/80 may be referred to as first bulbous regions 116a, the bulbous regions within the second region 120 of the structure 54/80 may be referred to as second bulbous regions 116b, and the bulbous regions within the third region 122 of the structure 54/80 may be referred to as third bulbous regions 116c. In the illustrated embodiment, the wide bulbous regions 110 correspond to the third bulbous regions 116c, and the narrower bulbous regions 108 correspond to the first and second bulbous regions 116a and 116b.

The view of FIG. 14D shows that the channel-material-pillars 51a (i.e., the channel-material-pillars within the memory-block-regions 12 and 14) are on a first pitch $P_1$ along the y-axis direction, and shows that the channel-material-pillars 51b (i.e., the channel-material-pillars within the separator structure 54) are on a second pitch $P_2$ along the y-axis direction. In some embodiments, the second pitch $P_2$ may be greater than or equal to the first pitch $P_1$. For instance, in some embodiments the second pitch $P_2$ may be at least about 5% greater than the first pitch $P_1$, at least about 10% greater than the first pitch $P_1$, etc.

Figure 15:
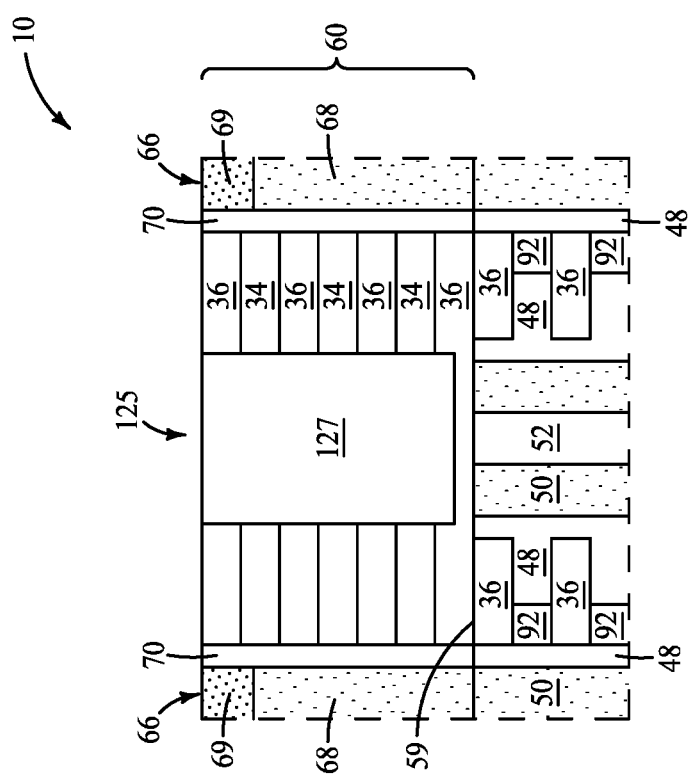
FIG. 15 is an enlarged view of an upper central portion of the integrated assembly depicted in FIG. 14B at an example process stage which may follow the process stage of FIG. 14B.

FIG. 15 shows an enlarged view of a central upper portion of FIG. 14B illustrating a process stage subsequent to FIG. 14B. As depicted, stack 60 over separator structure 54 is divided by formation of an opening extending into stack 60 through alternating first and second tiers into the bottom first tier of second material 36. The opening can be filled with a separation insulator material 127 to form SGD separation structure 125. Insulator material 127 can be the same or differ relative to insulative material 94 of panels 95 and 97.

Figure 16:
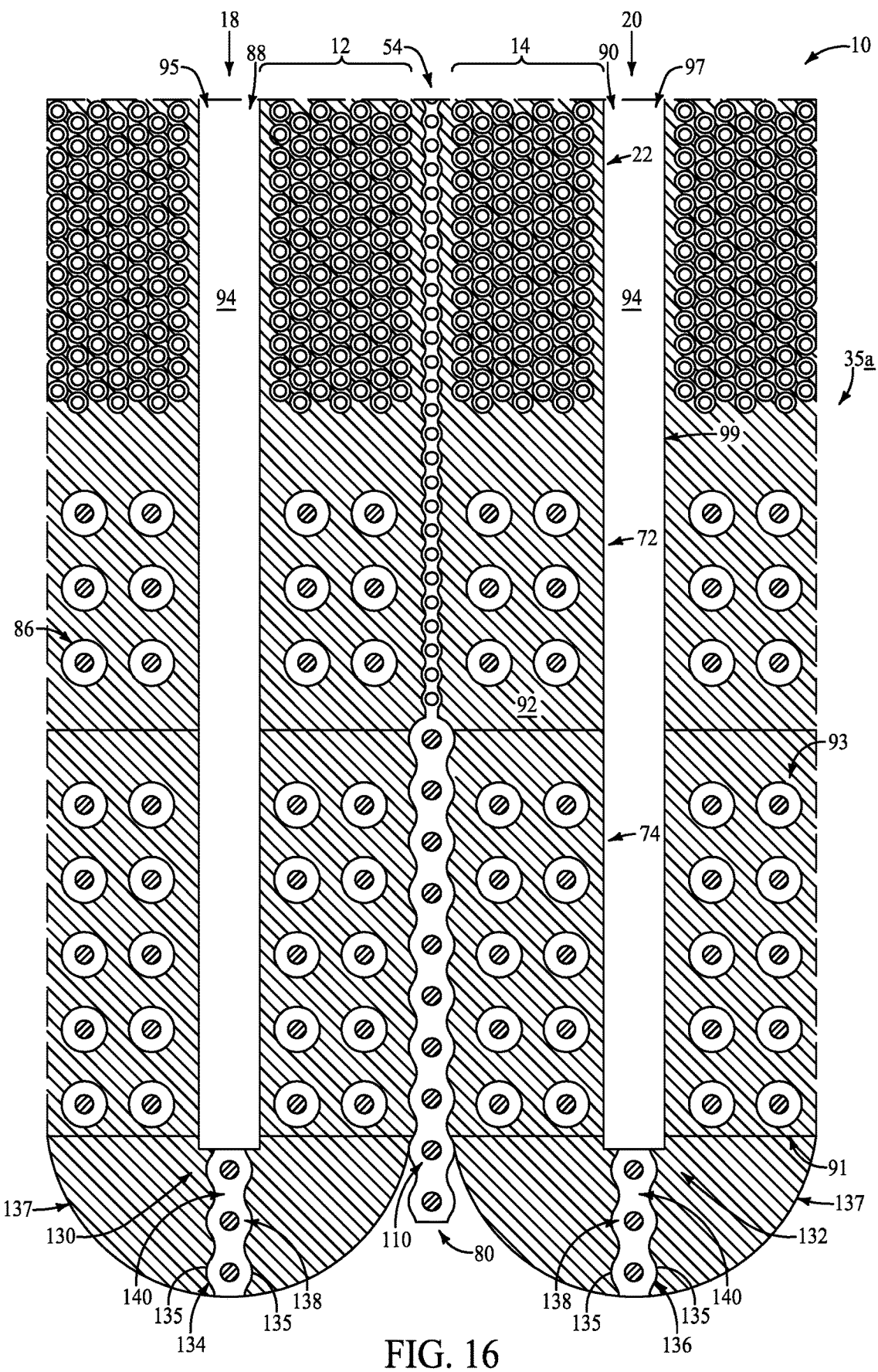
FIG. 16 is a diagrammatic top-down sectional view of an assembly at the process stage of FIG. 14 in accordance with an example method.

FIG. 16 shows the assembly 10 at a process stage analogous to that of FIG. 14, and shows additional features which may be provided along ends of the slit locations 18 and 20. Specifically, first and third separator structures 130 and 132 may comprise the panels 95 and 97, respectively, and may comprise projections 134 and 136 which extend beyond the routing staircase region (wordline staircase region) 74. The projections 134 and 136 have the same configuration as the separator structure 80, and in the shown embodiment have serpentining sidewalls 135 which extend along the y-axis direction. Additionally, the projections 134 and 136 comprise bulbous regions 138 which are analogous to the bulbous regions 110 of the separator structure 80. In some embodiments, the bulbous regions 138 of the projections 134 and 136 may be referred to as first bulbous regions, and the bulbous regions 110 of the separator structure 54/80 (which may be referred to as a second separator structure to distinguish it from the first and third separator structures 130 and 132) may be referred to as second bulbous regions. The second bulbous regions may be about the same width as the first bulbous regions, as shown.

The bulbous regions 138 of the projections 134 and 136 alternate with narrow regions 140 along the y-axis direction.

The conductive material 92 is formed by flowing conductive material into slits within the regions 18 and 20. The projections 134 and 136 may be utilized to assist in shaping the conductive material 92 so that such conductive material does not extend into regions laterally distant from the staircase region 74. In some embodiments, the staircase region 74 may be considered to comprise a front edge 93 (boundary between the SGD staircase region 72 and the wordline staircase region 74, diagrammatically illustrated with a line) and an opposing back edge 91 (diagrammatically illustrated with a line). The front edge 93 is adjacent to the SGD staircase region 72, and the back edge 91 is distal from the SGD staircase region. In the illustrated embodiment, the conductive level 35a has curved edges 137 which extend from the back edge of the wordline staircase region 74 to the serpentining sidewalls 135 of the projections 134 and 136. The conductive level 35a may be representative of the other conductive levels 35 within the stack 32 (FIG. 14B), and all of such conductive levels may have curved edges 137 analogous to the edges 137 shown in FIG. 16.

Figure 17:
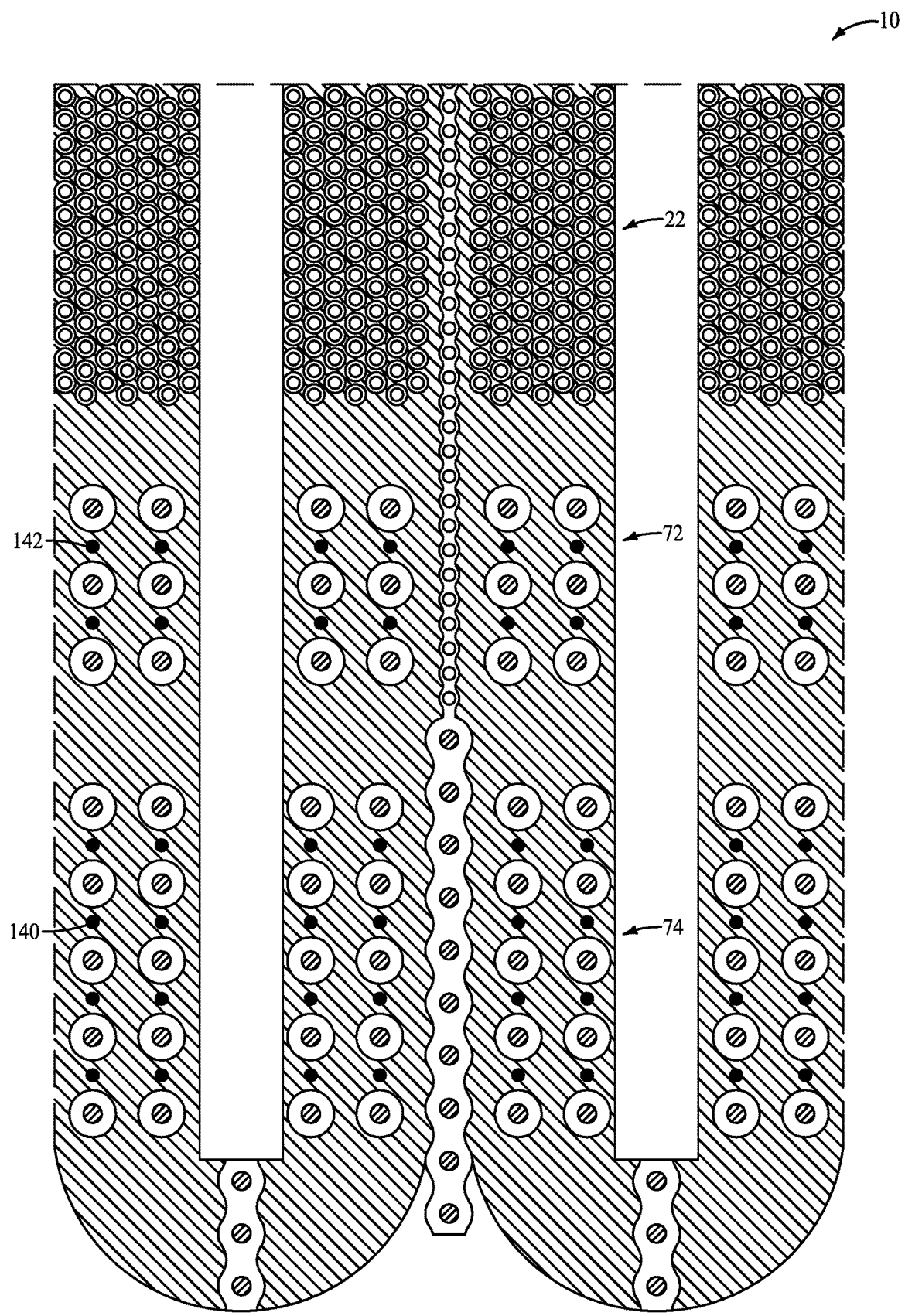
FIG. 17 is a diagrammatic top-down sectional view of an example integrated assembly at an example process stage which may follow the process stage of FIG. 16.

FIG. 17 shows a process stage which may follow that of FIG. 16. Conductive interconnects 140 are formed within the wordline staircase region 74, and conductive interconnects 142 are formed within the SGD staircase region 72. The interconnects 140 may be electrically coupled to individual wordlines (routing structures) within the wordline staircase region 74 (i.e., may be coupled to lines along the conductive levels 35 of FIG. 14B), and similarly the interconnects 142 may be electrically coupled to individual SGD lines (i.e., may be coupled to lines along the conductive levels 62 of FIG. 14B). The interconnects 140 and 142 may be electrically coupled with suitable circuitry (driver circuitry, decoder circuitry, etc.) associated with a memory configuration.

Figure 18:
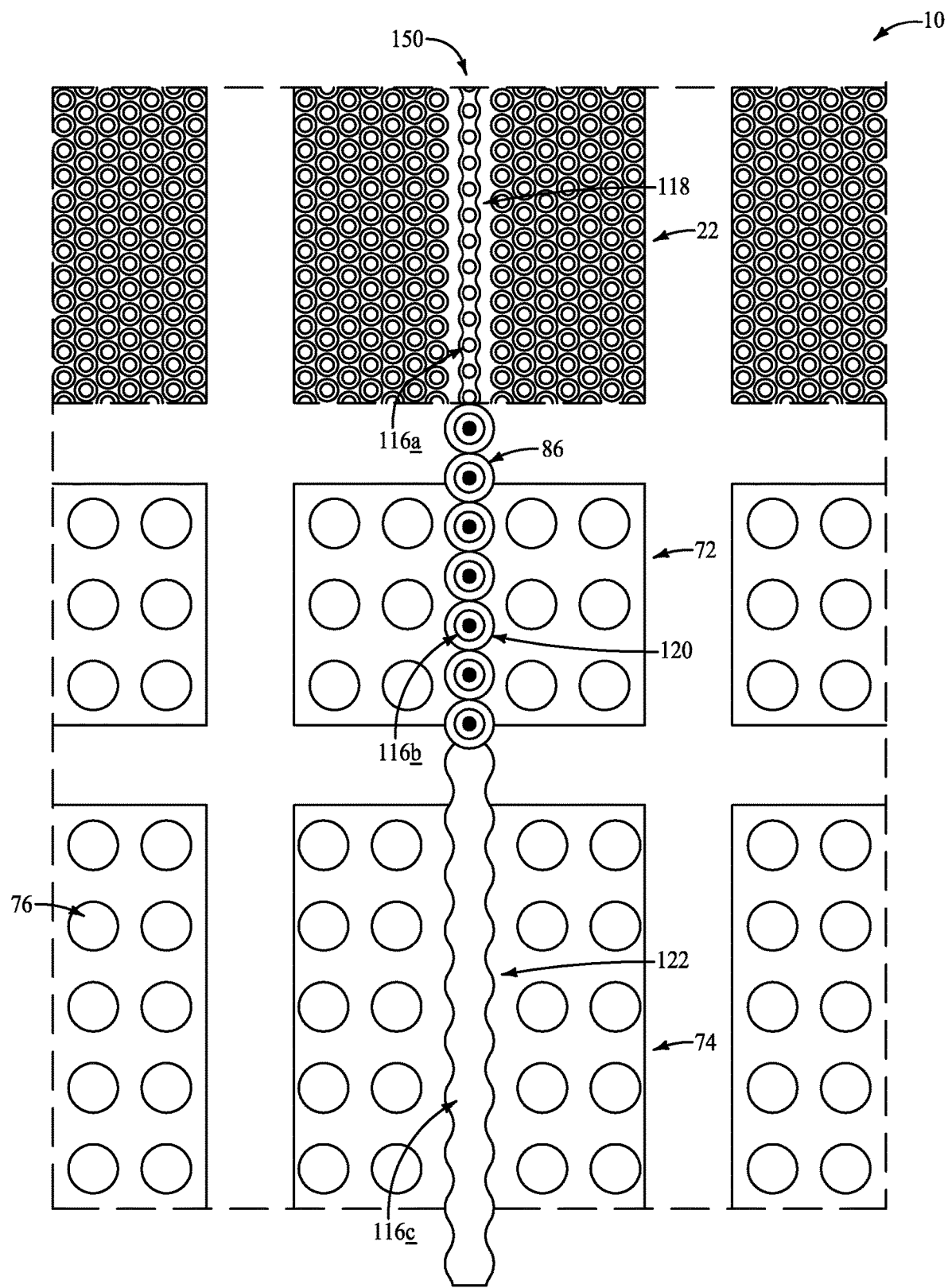
FIG. 18 is a diagrammatic top-down view of an example integrated assembly.

The embodiment described above with reference to FIG. 14D shows the separator structure 54/80 comprising the regions 118, 120 and 122 within the memory array region 22, the SGD staircase region 72 and the wordline staircase region 74, respectively. FIG. 18 diagrammatically illustrates a similar assembly, but shows a separator structure 150 in place of the separator structure 54/80. The assembly of FIG. 18 may be at a process stage analogous to any of the process stages described above with reference to FIGS. 11-14. The separator structure 150 of FIG. 18 comprises the regions 118, 120 and 122 within the memory array region 22, SGD staircase region 72 and wordline staircase region 74, respectively. However, unlike the embodiment of FIG. 14D, the embodiment of FIG. 18 shows the second region 120 of the separator structure 150 to have a different configuration than the first region 118 of the separator structure. The regions 118, 120 and 122 comprise bulbous regions 116a, 116b and 116c, respectively. The bulbous regions 116b may be similar to the support structures 86 described above with reference to FIG. 14, or may have other configurations.

The bulbous regions 116a, 116b and 116c of the separator structure 150 may have any suitable configurations relative to one another, with FIG. 18 showing one of many possible arrangements. In some embodiments, the bulbous regions 116b may be similar to the bulbous regions 116a (and may have substantially the same width as the bulbous regions 116a). In some embodiments, the bulbous regions 116b may be similar to the bulbous regions 116c (and may have substantially the same width as the bulbous regions 116c). In some embodiments, the bulbous regions 116b may be substantially different than both the bulbous regions 116a and the bulbous regions 116c.

Figure 19:
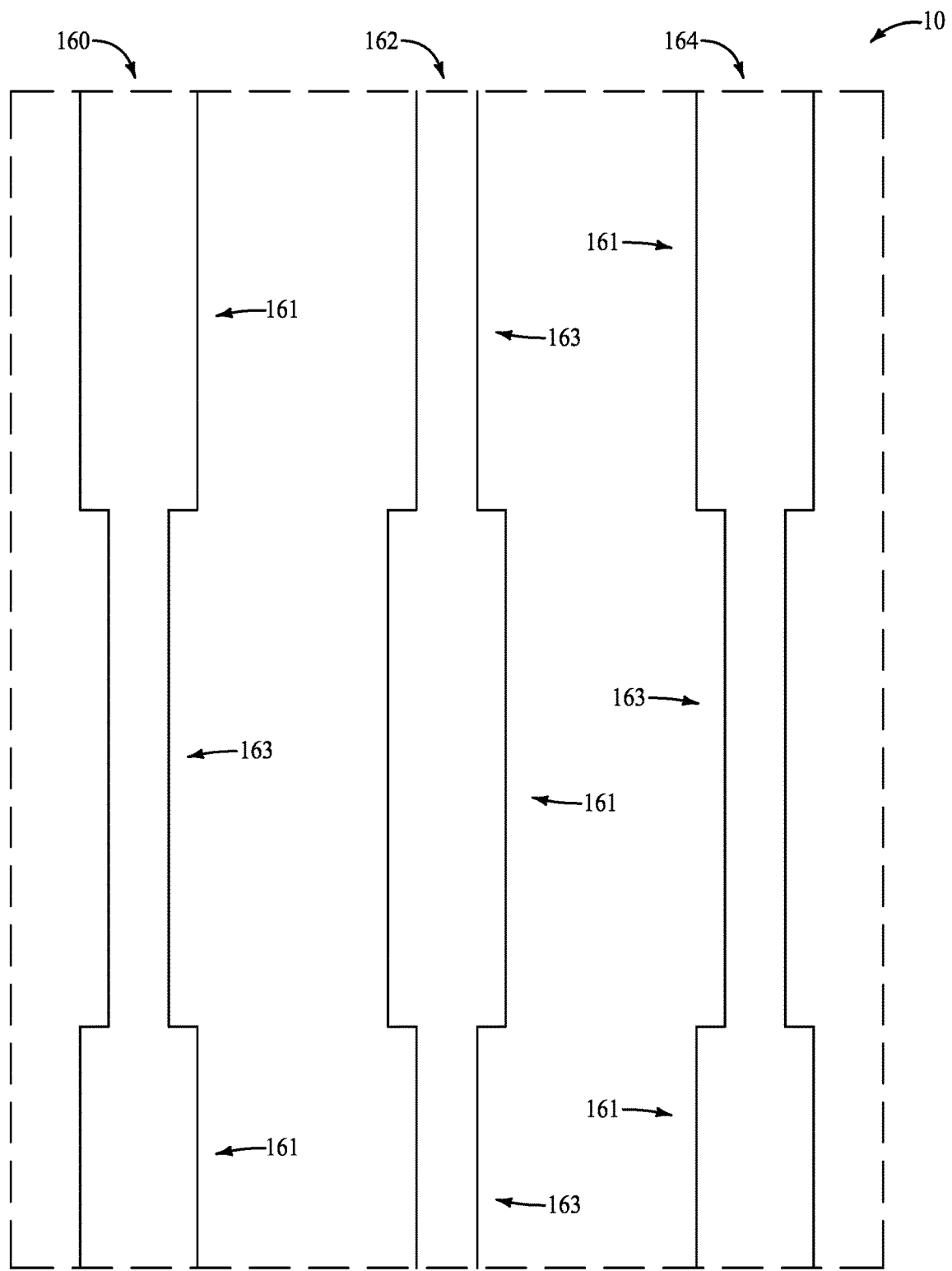
FIG. 19 is a diagrammatic top-down view of an example integrated assembly.
Figure 20:
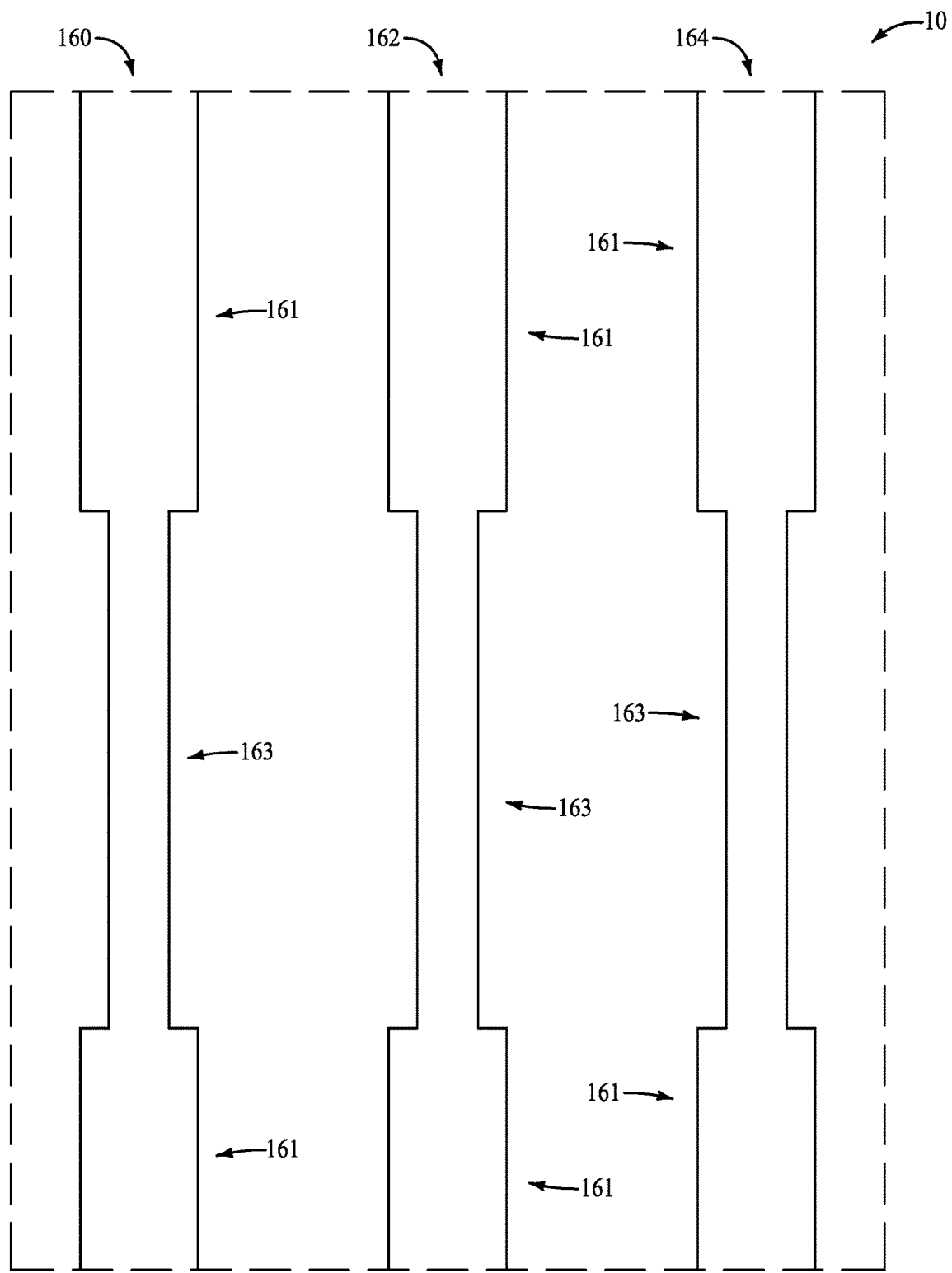
FIG. 20 is a diagrammatic top-down view of an example integrated assembly.

In some embodiments, separator structures may be formed to combine elements of the wide panel structures (i.e., panels 95 and 97) with elements of the narrow separator structures (e.g., the separator structures 54/80 of FIGS. 14-17, and the separator structure 150 of FIG. 18). FIGS. 19 and 20 diagrammatically illustrate separator structures 160, 162 and 164 which comprise wide panel regions 161 and narrow separator structure regions 163. The separator structures 160, 162 and 164 extend along a first direction (the illustrated y-axis direction), and the widths are measured along a second direction (the illustrated x-axis direction), with the second direction being orthogonal to the first direction.

In some embodiments, the wide regions 161 will be at least about 150% wider than the narrow regions 163. In some embodiments, the narrow regions 163 may be distinguished from the wide regions 161 because the narrow regions 163 will have at least a portion which extends through a second stack analogous to the stack 56 of FIG. 14B (i.e., a stack comprising alternating first and second insulative regions), while the wide regions 161 will extend through stacks analogous to the stack 32 of FIG. 14B (i.e., stacks comprising alternating insulative and conductive regions). The wide regions 161 may have straight sidewalls, while the narrow regions 163 have serpentining sidewalls analogous to the serpentining sidewalls described above relative to the structures of the 54/80 and 150. Such serpentining sidewalls are not shown FIGS. 19 and 20 in order to simplify the drawings.

FIG. 19 shows that the wide regions 161 may alternate with the narrow regions 163, and that the narrow regions 163 may be formed to be laterally adjacent to wide regions of neighboring separator structures. Specifically, the narrow region 163 of the separator structure 160 is laterally adjacent to the wide region 161 of the neighboring separator structure 162.

FIG. 20 shows that the wide regions 161 may alternate with the narrow regions 163, and that the narrow regions 163 of neighboring separating structures may be laterally adjacent to one another.

Although many of the openings described herein (e.g., 24, 76, etc.) are shown to be circular in top-down view (prior to merger of selected openings), it is to be understood that such openings may have any suitable closed shapes in top-down view, including, for example, oval, elliptical, polygonal, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a pair of adjacent memory-block-regions, and having a separator structure between the adjacent memory-block-regions. The memory-block-regions include a first stack of alternating conductive levels and first insulative levels. The separator structure includes a second stack of alternating second and third insulative levels. The second insulative levels are substantially horizontally aligned with the conductive levels, and the third insulative levels are substantially horizontally aligned with the first insulative levels.

Some embodiments include an integrated assembly having a first memory-block-region laterally between a first separator structure and a second separator structure, and having a second memory-block-region laterally between the second separator structure and a third separator structure. The first and third separator structures are at least about 150% wider than the second separator structure. The first, second and third separator structures extend along a first direction. The first and third separator structures have substantially straight sidewalls along the first direction, and the second separator structure has serpentining sidewalls along the first direction.

Some embodiments include a method of forming an integrated assembly. A first stack of alternating first and second materials is formed over a source structure. The second material is an insulative material. A region of the first stack is a memory array region and has a first memory-block-region laterally adjacent a second memory-block-region. A first array of cell-pillar-openings is formed within the first memory-block-region. A second array of the cell-pillar-openings is formed within the second memory-block-region. A linear string of the cell-material-openings is formed within a separator-structure-region between the first and second memory-block-regions. The cell-pillar-openings extend through the first stack. The linear string extends along a first direction. Interior regions of the cell-pillar-openings within the first and second arrays are protected with sacrificial material while leaving interior regions of the cell-pillar-openings of the linear string exposed. The first material is recessed from the exposed interior regions of the cell-pillar-openings of the linear string to merge the cell-pillar-openings of the linear string with one another along the first direction. The sacrificial material is removed. Cell materials are formed within the cell-pillar-openings of the first and second arrays, and within the merged cell-pillar-openings of the linear string. The cell materials include channel material, tunneling material, charge-trapping material and charge-blocking material. The channel material is configured as channel-material-pillars. The cell materials within the merged cell-pillar-openings are incorporated into a separator structure. The separator structure comprises a second stack which has alternating first and second insulative levels. The second insulative levels comprise the second material. A first slit is formed on an opposing side of the first memory-block-region from the separator structure. A second slit is formed on an opposing side of the second memory-block-region from the separator structure. The first material is removed with etchant flowed into the first and second slits to form voids. Conductive material is formed within the voids. Panels are formed within the first and second slits.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a pair of adjacent memory-block-regions, the memory-block-regions comprising a first stack of alternating conductive levels and first insulative levels; and
    a separator structure between the adjacent memory-block-regions, said separator structure comprising a second stack of alternating second and third insulative levels, the second insulative levels being substantially horizontally aligned with the conductive levels, and the third insulative levels being substantially horizontally aligned with the first insulative levels, the separator structure extending along a first direction and having a first region offset from a second region along the first direction, the first region comprising the second stack and the second region not comprising the second stack.

2. The integrated assembly of claim 1 comprising:
a conductive source structure under the memory-block-regions and under the separator structure;
first channel-material-pillars within the memory-block-regions and extending through the first stack to electrically couple with the source structure; and
second channel-material-pillars within the separator structure and extending through the second stack.

3. The integrated assembly of claim 2 wherein:
the first channel-material-pillars are along a first pitch along the first direction;
the second channel-material-pillars are along a second pitch along the first direction; and
the second pitch is greater than the first pitch.

4. The integrated assembly of claim 2 comprising one or more cell materials between the first channel-material-pillars and the first stack; and wherein the second insulative levels comprises said one or more cell materials.

5. The integrated assembly of claim 4 said one or more cell materials include silicon dioxide and silicon nitride.

6. The integrated assembly of claim 1 wherein the first and second regions have widths along a second direction orthogonal to the first direction, and wherein the second region is at least about 150% wider than the first region.

7. The integrated assembly of claim 1 wherein the second region comprises an insulative panel extending through the first stack.

8. An integrated assembly, comprising:
a pair of adjacent memory-block-regions, the memory-block-regions comprising a first stack of alternating conductive levels and first insulative levels; and
a separator structure between the adjacent memory-block-regions, said separator structure comprising a second stack of alternating second and third insulative levels, the second insulative levels being substantially horizontally aligned with the conductive levels, and the third insulative levels being substantially horizontally aligned with the first insulative levels; and
an SGD stack over the first and second stack, stacks; and wherein a first region of the separator structure being between the first and second memory-block-regions under the SGD stack.

9. The integrated assembly of claim 8 wherein the memory-block-regions are within a memory array region, wherein an SGD staircase region is laterally offset from the memory array region, with said SGD staircase region including the SGD stack over the first stack; and wherein the separator structure has a second region which extends through the first stack in the SGD staircase region.

10. The integrated assembly of claim 9 wherein the conductive levels include routing structures; wherein a routing structure staircase region is laterally offset from the SGD staircase region; wherein the routing structure staircase region includes the first stack; and wherein the separator structure has a third region which extends through the first stack in the routing structure staircase region.

11. The integrated assembly of claim 10 wherein the first region of the separator structure includes first bulbous regions alternating with first narrow regions, the second region of the separator structure includes second bulbous regions alternating with second narrow regions, and the third region of the separator structure includes third bulbous regions alternating with third narrow regions; and wherein the third bulbous regions are wider than the first bulbous regions.

12. The integrated assembly of claim 11 wherein the second bulbous regions are about a same width as the first bulbous regions.

13. The integrated assembly of claim 11 wherein the second bulbous regions are about a same width as the third bulbous regions.

14. The integrated assembly of claim 11 wherein the second bulbous regions are a different width than the first bulbous regions, and are a different width than the third bulbous regions.

15. The integrated assembly of claim 1 wherein the first stack includes at least two decks stacked one atop another.

16. An integrated assembly, comprising:
a first memory-block-region laterally between a first separator structure and a second separator structure;
a second memory-block-region laterally between the second separator structure and a third separator structure;
wherein the first and third separator structures are at least about 150% wider than the second separator structure;
wherein the first, second and third separator structures extend along a first direction;
wherein the first and third separator structures have substantially straight sidewalls along the first direction; and
wherein the second separator structure has serpentining sidewalls along the first direction.

17. The integrated assembly of claim 16 wherein the second separator structure includes bulbous regions alternating with narrow regions along the first direction.

18. The integrated assembly of claim 16 wherein the first and second memory-block-regions are within a memory array region; further comprising an SGD staircase region laterally offset from the memory array region and a routing structure staircase region laterally offset from the SGD staircase region; and wherein the first, second and third separator structures extend across the SGD staircase region and the routing structure staircase region.

19. The integrated assembly of claim 18 wherein the second separator structure has a first region within the memory array region, a second region within the SGD staircase region, and a third region within the routing structure staircase region; and wherein the second separator structure is wider within at least one of the second and third regions than within the first region.

20. The integrated assembly of claim 19 wherein the serpentining sidewalls of the second separator structure continue across the second and third regions.

21. The integrated assembly of claim 20 comprising projections of the first and third separator structures that extend beyond the routing structure staircase region, and wherein said projections have serpentining sidewalls.

22. The integrated assembly of claim 21 wherein the projections include bulbous regions alternating with narrow regions along the first direction.

23. The integrated assembly of claim 22 wherein the bulbous regions and narrow regions of the projections are first bulbous regions and first narrow regions; wherein the third region of the second separator structure has second bulbous regions alternating with second narrow regions along the first direction; and wherein the second bulbous regions are about a same width as the first bulbous regions.

24. The integrated assembly of claim 23 comprising a stack of alternating insulative levels and conductive levels within the memory array region, the SGD staircase region, and the routing structure staircase region; wherein the routing staircase region has a front edge adjacent the SDG staircase region and has a back edge in opposing relation to the front edge; and wherein the conductive levels have curved edges extending from the back edge of the routing staircase region to the serpentining sidewalls of the projections.

* * * * *